US012764887B2

(12) United States Patent
Gururaja et al.

(10) Patent No.: US 12,764,887 B2
(45) Date of Patent: Oct. 13, 2026

(54) POWER AND TEMPERATURE MANAGEMENT OF DEVICES

(71) Applicant: Altera Corporation, San Jose, CA (US)

(72) Inventors: Paniraj Gururaja, Bangalore (IN); Navneeth Jayaraj, Bangalore (IN); Mahammad Yaseen Isasaheb Mulla, Bangalore (IN); Nitesh Gupta, Bangalore (IN); Hemanth Maddhula, Bangalore (IN); Laxminarayan Kamath, Bangalore (IN); Jyotsna Bijapur, Bangalore (IN); Delraj Gambhira Dambekana, Bengaluru (IN); Vikrant Thigle, Bangalore (IN); Amruta Misra, Bangalore (IN); Anand Haridass, Bangalore (IN); Rajesh Poornachandran, Portland, OR (US); Krishnakumar Varadarajan, Bangalore (IN); Sudipto Patra, Bangalore (IN); Nikhil Rane, Bengaluru (IN); Teik Wah Lim, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 51 days.

(21) Appl. No.: 17/955,183

(22) Filed: Sep. 28, 2022

(65) Prior Publication Data

US 2023/0037609 A1 Feb. 9, 2023

(51) Int. Cl.
*H05K 7/14* (2006.01)
*H05K 7/20* (2006.01)

(52) U.S. Cl.
CPC ......... *H05K 7/1485* (2013.01); *H05K 7/1457* (2013.01); *H05K 7/20136* (2013.01)

(58) Field of Classification Search
CPC ..................................... G06F 9/44; G06F 1/32
See application file for complete search history.

(56) References Cited

U.S. PATENT DOCUMENTS

2005/0055587 A1* 3/2005 Lee ........................... G06F 1/28 713/300
2012/0136498 A1* 5/2012 Chen ......................... G06F 1/20 700/297
2022/0012396 A1 1/2022 Jayaraj et al.

OTHER PUBLICATIONS

Dostal, Frederik, "Power Management for FPGAs", Analog Dialogue 52-03, Mar. 2018, 4 pages.
Harris, Daniel, "Reducing FPGA Power Consumption", https://www.electronicdesign.com/technologies/embedded/digital-ics/fpga/article/21795214/reducing-fpga-power-consumption, Feb. 12, 2008, 4 pages.

(Continued)

*Primary Examiner* — Keshab R Pandey
(74) *Attorney, Agent, or Firm* — Nicholson De Vos Webster & Elliott LLP

(57) ABSTRACT

Examples described herein relate to an interface and a network interface device coupled to the interface and comprising circuitry to: control power utilization by a first set of one or more devices based on power available to a system that includes the first set of one or more devices, wherein the system is communicatively coupled to the network interface and control cooling applied to the first set of one or more devices.

15 Claims, 21 Drawing Sheets

(56) References Cited

OTHER PUBLICATIONS

Meixedo, Joao Miguel R. and Araujo, Antonio Jose D., "RTL design techniques to reduce the power consumption of FPGA based circuits", DCIS 2008 : 23rd Conference on Design of Circuits and Integrated Systems, Nov. 2008, 6 pages.
Nasser, Yehya et al., "RTL to Transistor Level Power Modelling and Estimation Techniques for FPGA and ASIC: A Survey", IEEE TCAD Circuits and Systems, Jun. 2020, 15 pages.

* cited by examiner

POWER AND TEMPERATURE MANAGEMENT OF DEVICES

BACKGROUND

Infrastructure Processing Unit (IPU) are network interface devices in managed data centers and Edge networks can deploy workloads on field programmable gate array (FPGA)-based devices closely coupled with application specific integrated circuits (ASICs) and compute engines to free up cores on a server to perform applications and services. IPUs can be implemented on a Peripheral Component Interconnect express (PCIe) form factor Add-In-Card. IPUs can be implemented as a Multiple Chip on Package (MCP), a system on chip (SoC) with a central processing unit (CPU) and Intel® Platform Controller Hub (PCH) die, FPGA fabric die, and Datapath Accelerator (DPA) die. When integration of high-power devices in a form factor such as an Add-In-Card or Package, there are challenges related to the power density and temperature profile across the devices and within device dies. Factors that contribute to power and temperature distribution include FPGA fabric resource utilization, fabric logic toggle rates, SoC workload, and activity across devices on the die. The power density within the FPGA die itself can vary with different customer designs as the floorplan of the logic blocks could be different. Devices on IPUs can generate heat that are cooled to avoid malfunction of the devices. Cooling solutions for IPUs can include a heat sink and air flow from server fans or active cooling.

DETAILED DESCRIPTION

Figure 1:
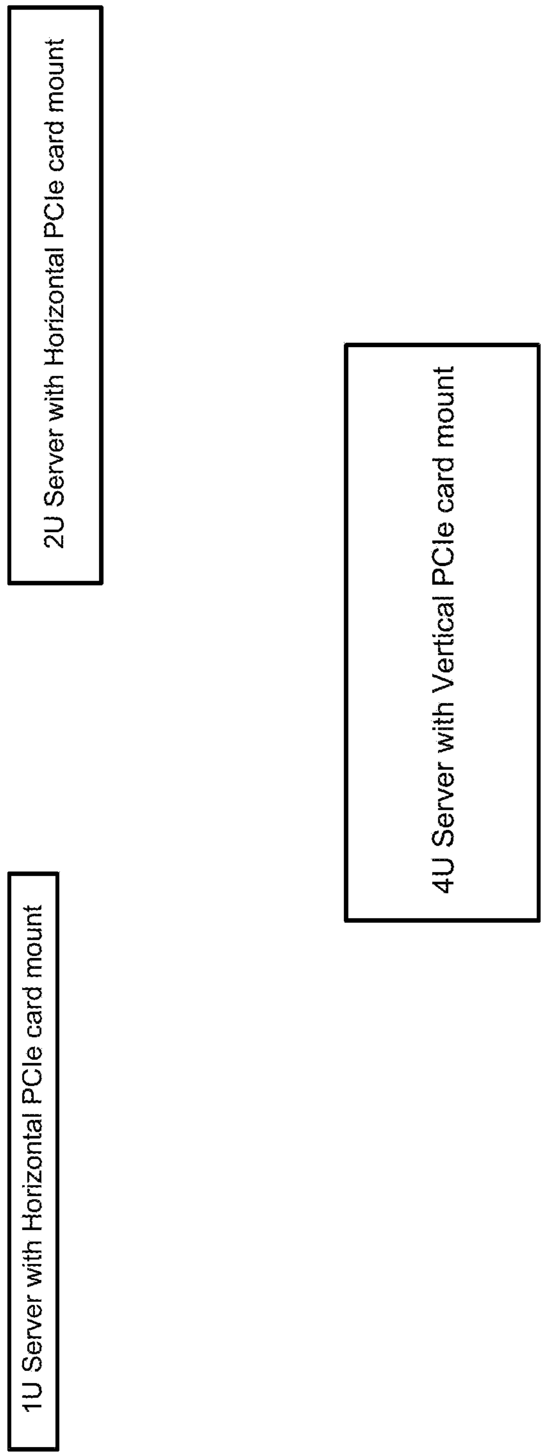
FIG. 1 depicts an example of different sized rackmount servers.

Network interface device cards can be plugged into various server environments, such as 1U height server, 2U servers, 4U servers, etc. FIG. 1 depicts an example of different sized rackmount servers. In this example, 1U, 2U, and 4U sized rackmount servers are depicted, where U represents unit. For example, the 1U server can be mounted horizontally with a Peripheral Component Interconnect express (PCIe) card mount. For example, the 2U server can be mounted horizontally with a PCIe card mount. For example, the 4U server can be mounted vertically with a PCIe card mount. 1U is a smaller rackmount than 4U. Network interface device cards can be plugged-in vertically, horizontally to a riser card with card facing server TOP cover, or card facing bottom of a server. Air flow direction through the servers can be different for different sized rackmount servers and different orientations, such as, front-to-back or back-to-front. Hence, a network interface device card and devices in the rackmount server can receive different airflow directions for cooling based on deployment. When the server or targeted server rackmount size or orientation changes, the network interface device may not be receiving sufficient cooling.

Network interface devices can include a combination of processor and accelerator devices. These devices can operate at different power levels, thereby enabling multiple performance profiles. Operation at different power levels can utilize different cooling parameters to cool the devices of the network interface device. Some examples can detect environmental and ambient conditions such as network interface device orientation, proximity to other PCIe cards, airflow through the card surface, acoustics of the ambience, and other factors. In some examples, a network interface device or other processor can execute software to determine an environment of operation of a card and based on the determinations, adjust parameters related to power usage and performance.

Some examples of a system can monitor physical ambient condition data near and in a network interface device deployed in a server and determine and set operating parameters of on-board acceleration devices based on ambient condition data. The system can be deployed in a network interface device or server. Determination of operating parameters of on-board acceleration devices based on ambient condition data can be based on a repeatedly trained machine learning model to attempt to increase performance per watt and reduce operating monetary costs and environmental impact by a datacenter. In some examples, the network interface device can determine operating parameters based on profiles set by datacenter fleet manager. In some examples, the network interface device can advertise to a host server system the operating parameters of on-board acceleration devices and the host server system can configure the settings of on-board acceleration devices based on the received operating parameters of on-board acceleration devices. By receipt of ambient conditions such as airflow, orientation of the network interface device, whether an adjacent slot is populated, the system can increase power levels of devices to enable higher performance when larger cooling capacity is available or decrease power levels of devices for potentially decreased performance when less cooling capacity is available.

Figure 2:
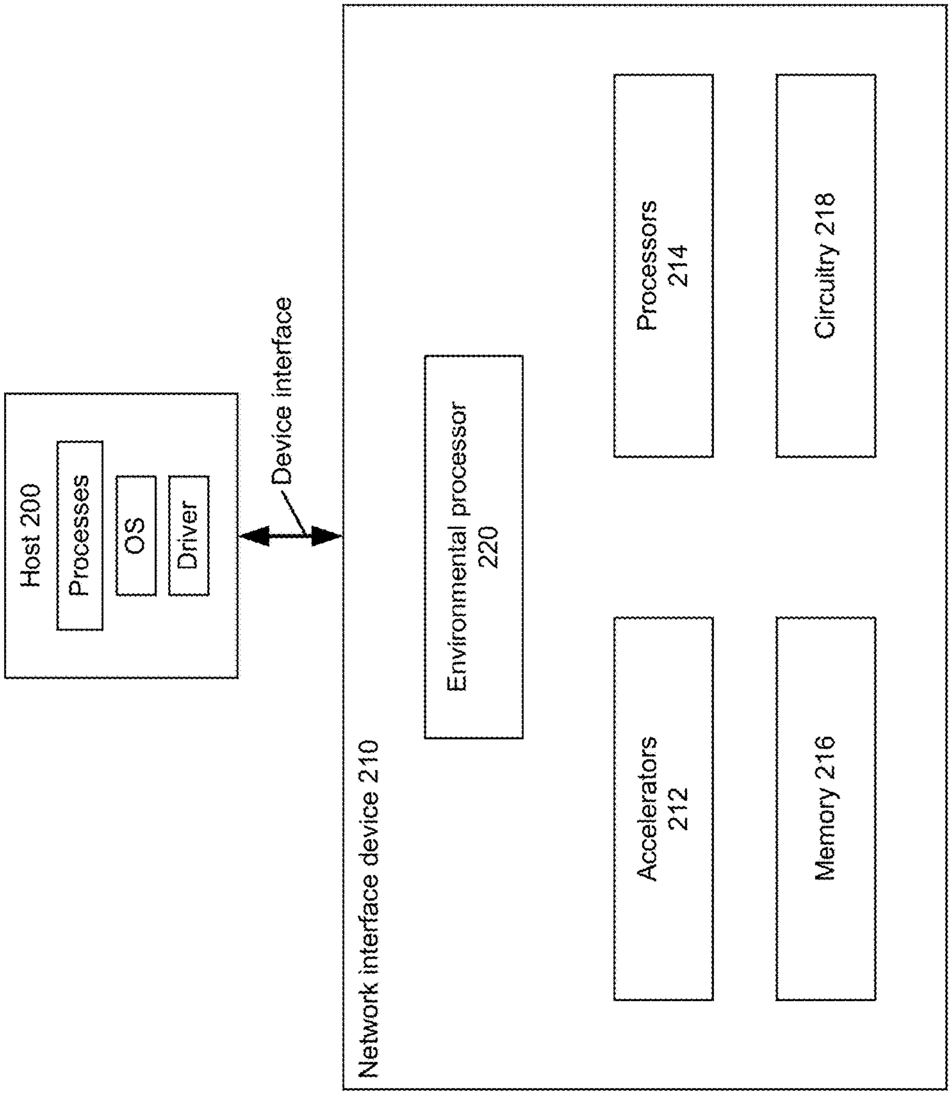
FIG. 2 depicts an example system.

FIG. 2 depicts an example system. Host server system 200 can include one or more processors, one or more memory devices, one or more device interfaces, as well as other circuitry and software described at least with respect to one or more of FIGS. 18-20. Processors of host 200 can execute software such as applications (e.g., microservices, virtual machine (VMs), microVMs, containers, processes, threads, or other virtualized execution environments), operating system (OS), and one or more device drivers. For example, an application executing on host 200 can utilize network interface device 210 to receive or transmit packet traffic as well as process packet traffic after receipt or prior to transmission.

To connect with host server 200, network interface device 210 can be positioned within 1U, 2U, and other rackmount card dimensions as described in Electronic Industries Association (EIA) standard EIA-310-D (1992) (and variations thereof). In some examples, network interface device 219 can include one or more of: a network interface controller (NIC), a remote direct memory access (RDMA)-enabled NIC, SmartNIC, router, switch, forwarding element, infrastructure processing unit (IPU), data processing unit (DPU), or network-attached appliance. Network interface device 210 can include one or more devices (e.g., accelerators 212, processors 214, memory 216, circuitry 218, or others).

At or after installation of network interface device 210 for operation with host server 200, environmental processor 220 can determine physical ambient environment including one or more of: airflow rate determination, air flow direction, orientation, adjacent slot occupancy, ambient noise levels, or others. Environmental processor 220 can be implemented as one or more of: one or more processors that execute instructions or firmware, one or more application specific integrated circuits (ASICs); one or more field programmable gate arrays (FPGAs), or other circuitry. Environmental processor 220 can execute firmware to perform learning and inference of ambient environment and advertise operating profiles to a host server. In some examples, firmware can be part of the Intel® Open FPGA Stack (IOFS) shell design for network interface device 210.

Airflow rate determination can be performed as follows. At (1), at or after power-on of network interface device 210, data from temperature sensors and power sensors on network interface device 210 can be stored. Data can include temperature measured by temperature meters at one or more multiple physical locations in network interface device 210 and power utilized by one or more devices in network interface device 210. At (2), sensor data can be measured at time intervals to determine a rate of change of temperature at one or more physical locations of network interface device 210. At (3), an observed rate of change of sensor data with respect to input power are correlated to pre-trained data based on IPU heat sink solution that are available on the non-volatile memory of network interface device. A heat sink can have an associated cooling curve (Y: heat sink thermal resistance and X: flow rate). To determine air flow rate, a controller (e.g., baseboard management controller (BMC) or a controller of environmental processor 220) can measure junction temperature from the network interface device, with different power on devices to create a profile to compute the thermal resistance such as:

$$Tj1 = T\text{amb} + P1 * R$$

$$Tj2 = T\text{amb} + P2 * R$$

$$Tjn = T\text{amb} + Pn * R$$

where:

- Tj1, Tj2 . . . Tjn are the junction temperatures measured from the device,
- P1, P2 . . . Pn are the power setpoints on the device,
- Tamb is the ambient temperature that is read from the on board inlet air temperature sensor, and
- R is the thermal resistance of the heat sink solution for the particular air flow condition.

From the above readings, the controller can compute the R, and from a pre-loaded heatsink thermal resistance profile (e.g., thermal resistance versus airflow), the controller can compute air flow for particular thermal resistance. The computed air flow value could be the outcome of the airflow rate inference.

Air flow direction determination can be made based on a temperature gradient observation on the board temperature sensors because one temperature sensor at front (air entrance) and one temperature sensor at end (air exit). The air flow direction impacts the temperature gradient on accelerator devices on network interface device. Air flow direction is determined based on temperature being lower at entrance and higher at exit.

Air flow direction inference can be made by measuring the difference in temperature between the front edge temperature sensor and the rear edge temperature sensor. The temperature sensor that gets the inlet air will have lower temperature, and the exit air would be heated by the system and the exit temperature sensor will read higher value. Hence, for forward flow, the front edge temperature sensor can read a lower temperature value than that of the rear edge temperature sensor, and vice versa for reverse flow.

Orientation inference of the network interface device when the network interface device card is plugged into the server can be determined based on a gyroscope. Orientation can be vertical, horizontal (e.g., network interface device top cover facing top), horizontal inverted (e.g., network interface device top cover facing bottom). The orientation can impact heat sinking characteristics of certain thermal solution, such as spring loaded heat sinks. An inference engine can use the orientation context to look up a performance matrix based on orientation.

Ambient noise level determination can be based on noise contribution from fans by microphone. For example, noise level (dB) can be used to predict fan speed range. A microphone on the network interface device can measure the ambient noise levels inside the server. Environmental processor 220 can determine and advertise power levels to achieve acoustic limits. For example, deployment in telecom offices may be subject to acoustic levels and Network Equipment-Building System (NEB S) requirements.

The presence of add-in cards in adjacent slots to network interface device 210 can impact thermal performance of network interface device 210. Environmental processor 220 can determine adjacent slot occupancy based on proximity sensors. Proximity sensors mounted on the top cover and the bottom cover of the network interface device can enable the controller to detect presence of Add-In-Cards on the adjacent slots.

Examples can be applied to other types of add in cards such as: accelerator devices, memory devices, graphics processing unit (GPU) based accelerator cards, Ethernet NIC cards, SmartNIC cards, and others.

A controller (e.g., environmental processor) can exit a learning phase of the context aware mode by updating the various ambient parameters that were inferred. The inferred values of these parameters can be updated in holding registers, which are accessible by configuration firmware running in the controller. After the learning phase completes, the configuration phase starts, and the controller can read inferred parameters from holding registers and look up a power profile table stored in the configuration flash to identify an FPGA configuration profile (images) that fits the power levels associated to the inferred ambient conditions such as airflow, airflow direction, orientation etc. The power profile lookup table can include a mapping of the ambient parameters to the FPGA profiles (images), as shown below as an example:

| Air Flow (CFM) | Air Flow Direction | Orientation | Adjacent slot occupancy | Ambient noise (dB) | FPGA configuration profile |
|---|---|---|---|---|---|
| 16-22 | Forward | Horizontal | Nil | 30 | FPGA User Image 1 (80 W FPGA power) |
| 16-22 | Reverse | Horizontal | Nil | 30 | FPGA User Image 2 (70 W FPGA power) |
| 12-14 | Forward | Horizontal | Nil | 30 | FPGA User Image 3 (50 W FPGA power) |
| 16-22 | Forward | Vertical | Yes | 30 | FPGA User Image 3 (50 W FPGA power) |
| 16-22 | Forward | Vertical | Nil | 80 | FPGA User Image 3 (50 W FPGA power) |

When or after the controller identifies an FPGA configuration profile from the look-up table based on the inferred parameters, the FPGA configuration can be performed, and the image can load into an FPGA. Network interface device 210 can complete configuration and be ready for operation.

In some examples, the look up table could be managed by host 200 motherboard's controller (e.g., BMC, Intel® Management or Manageability Engine (ME), or other devices). Environmental processor 220 of network interface device 210 can provide the inferred ambient conditions to the motherboard controller, which performs lookup and picks an FPGA image to configure network interface device 210.

Environmental processor 220 can determine power and performance levels for on-board devices based ambient conditions such as on one or more of: airflow rate determination, air flow direction, orientation, adjacent slot occupancy, ambient noise levels, or others. Host server 200 can apply one of multiple profiles of performance capabilities based on ambient conditions received from environmental processor 220. Examples of profiles include: lower total cost of ownership (TCO) profile, lower acoustic profile, or others. Lower TCO profile can provide a baseline offload performance with ability for host 200 to lower power envelop supplied to network interface device 210 as well as lower fan speed, to attempt to lower operating costs. Lower acoustic profile can restrict fan and power usage to stay within the acoustic compliance region as per standards such as NEBS. Based on applicable profile, host server 200 and/or the datacenter fleet manager can pick a profile to apply to select operating parameters such as one or more of: CPU core frequency, number of active CPU cores, fan speed, number of active fans, and others.

Figure 3:
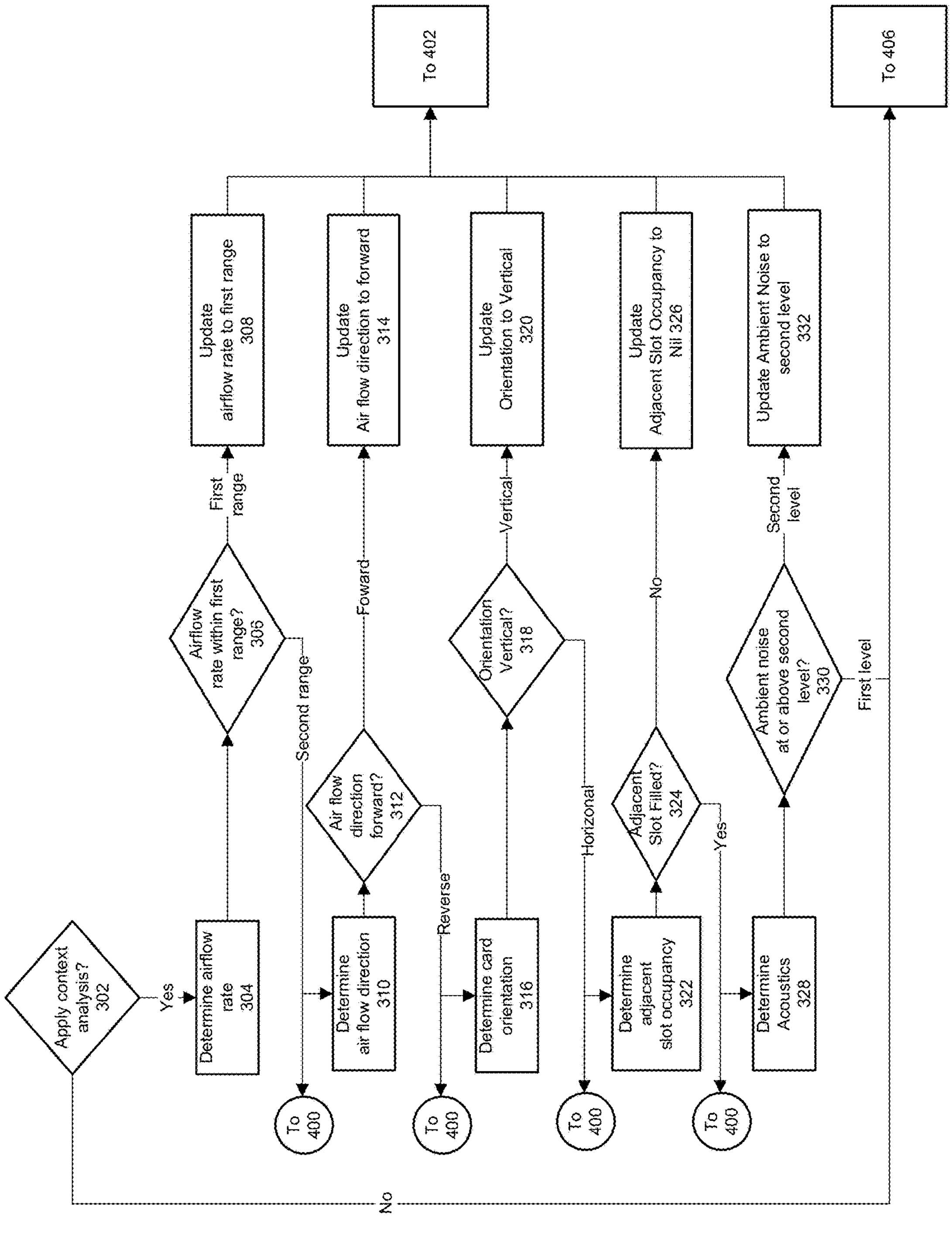
FIG. 3 depicts an example process to determine operating parameters of one or more devices in a in a card.

FIG. 3 depicts an example process to determine operating parameters of one or more devices in a in a card. The card can include a network interface device, one or more accelerators, one or more memory devices, one or more processors, and other devices. The process can occur at or after firmware boot of a network interface device. At 302, a determination can be made of whether to apply ambient context analysis to determine operating parameters of one or more devices in a network interface device. Based on an indicator to perform context analysis, the process can proceed to 304. Based on an indicator not to perform context analysis, the process can proceed to 406 of FIG. 4.

At 304, a determination of airflow rate can be performed. At 306, based on airflow rate being within a first range, the process can proceed to 308 to update with airflow range being in first range and proceed to 402 of FIG. 4. At 306, based on airflow rate being within a second range, the process can proceed to 310 and the airflow rate being within a second range can be utilized in the process of FIG. 4 via 400.

At 310, a determination of airflow direction can be performed. At 312, based on airflow direction being forward direction, the process can proceed to 314 to update airflow direction being forward and proceed to 402 of FIG. 4. At 312, based on airflow direction being backward direction, the process can proceed to 316 and the airflow direction can be utilized in the process of FIG. 4 via 400.

At 316, a determination of card orientation can be performed. At 318, based on card orientation being vertical, the process can proceed to 320 to update a card orientation as being vertical and proceed to 402 of FIG. 4. At 318, based on airflow direction being not vertical (e.g., horizontal), the process can proceed to 322 and the card orientation can be utilized in the process of FIG. 4 via 400.

At 322, a determination of adjacent slot occupancy can be performed to determine whether one or more cards are adjacent to the card. At 324, based on adjacent slot occupancy being false, the process can proceed to 326 to update an adjacent slot occupancy as being nil or empty and proceed to 402 of FIG. 4. At 324, based on adjacent slot occupancy being true, the process can proceed to 328 and the adjacent slot occupancy can be utilized in the process of FIG. 4 via 400.

At 328, a determination of ambient noise and acoustics of the current card can be performed. At 330, based on ambient noise being at or above a second level, the process can proceed to 332 to update ambient noise as being at or above a second level. At 330, based on ambient noise being below the second level (e.g., first level), the process can proceed to 400 and the ambient noise level being below the second level can be utilized in the process of FIG. 4 via 406.

Figure 4:
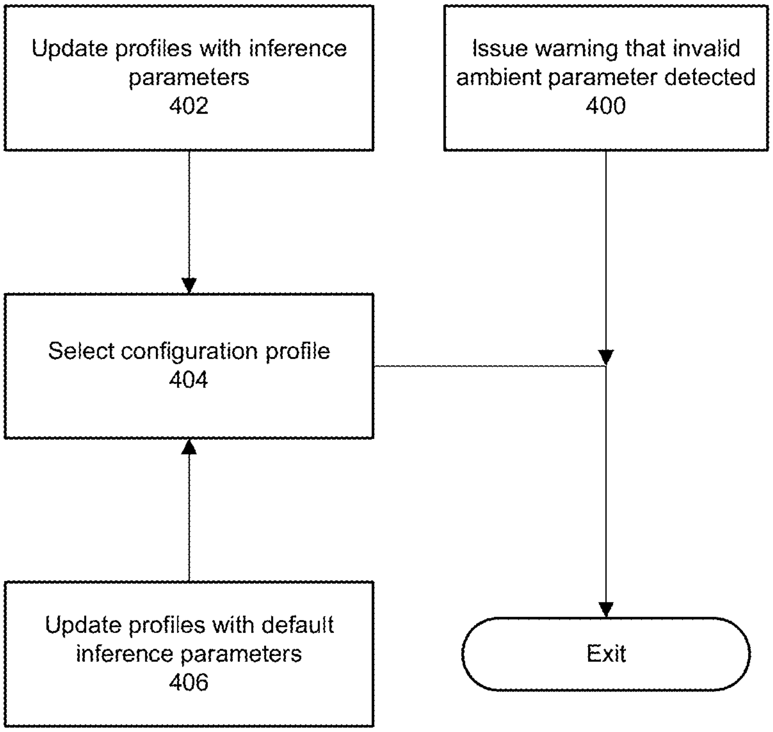
FIG. 4 depicts an example process.

FIG. 4 depicts an example process that can be used to apply a profile to set for a card. Based on a call to 400, a warning can be issued to a controller concerning one or more invalid ambient parameter at the card. The controller can include a host BMC, microcontroller, or other circuitry.

Based on a call to 402, profiles can be updated with inference parameters from the operating parameters determined in the process of FIG. 3. Updating profiles can include utilizing inferred ambient conditions. At 404, a configuration profile can be selected to apply to select applied power based on inferred ambient conditions. The configuration profile can be selected from a lookup table.

Based on a call to 406, profiles can be updated with default inference parameters and a configuration profile can be selected to apply to select applied power based on default ambient conditions (at 404).

Node Power Management

Figure 5:
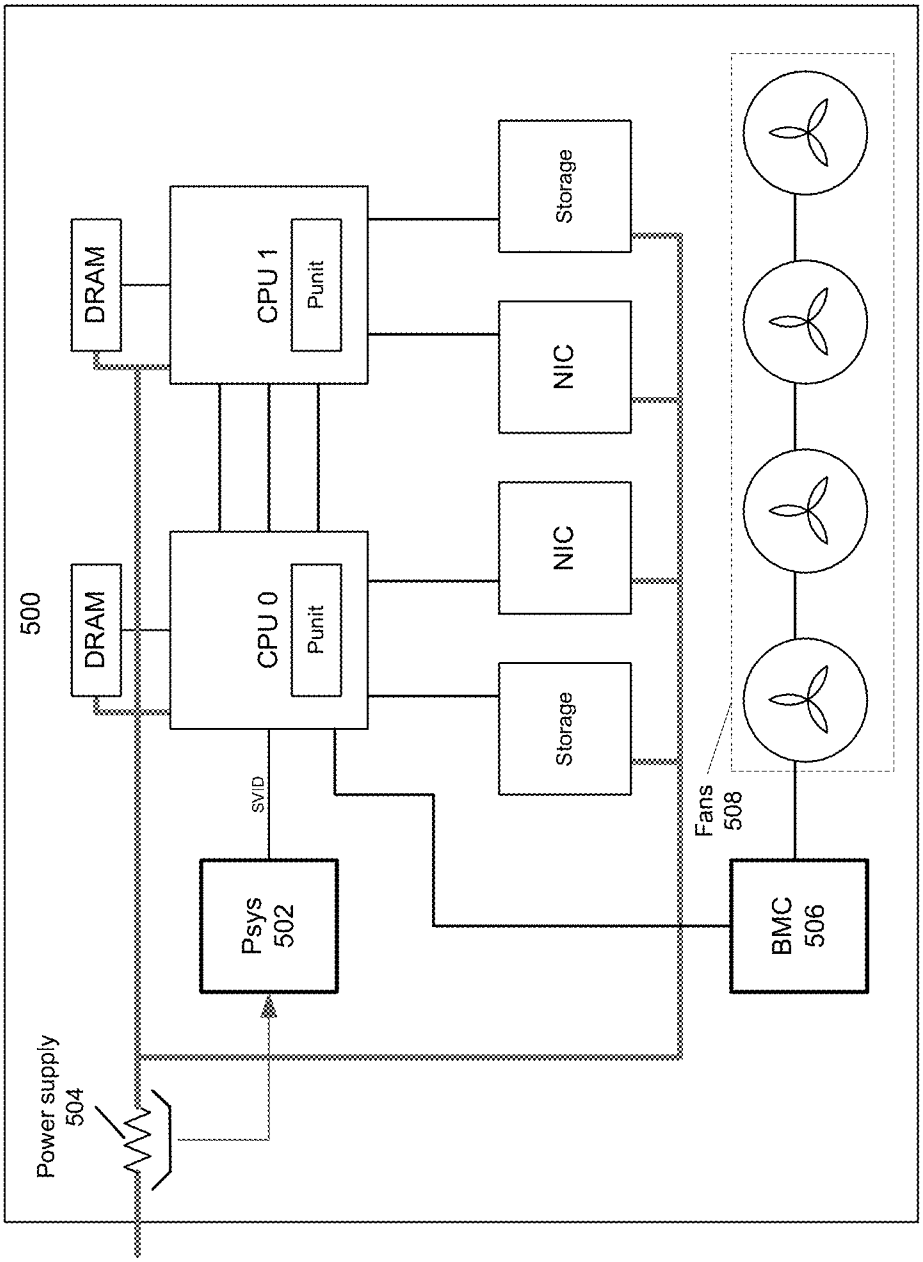
FIG. 5 shows an example of a power management device.

FIG. 5 shows an example of a power management device (Psys). Psys 502 can measure total power consumed by node 500. In this example, node 500 includes two CPU sockets (2S) as well as two memory devices (e.g., DRAM), two storage devices, and two NICs. A power unit (Punit) associated with CPU0 can read power consumed by the node based on power output from power supply. Based on thermal and power headroom available on the node, the Punit can increase frequency of CPU0 and/or CPU1 (to increase power consumption) or decrease frequency of CPU0 and/or CPU1 (to reduce power consumption). BMC 506 (or other controller) can control fan speed of fans 508 by reading platform temperature sensors (not shown) to adjust temperature of node 500.

In some examples, BMC 508 can statically configure fan speed of fans 508 based on factory provisioned thermal design power (TDP), thermal, power, or energy guard rails. However, as active workloads and utilization change, the settings of power management and fan speed may not be lead to acceptable temperature control of node 500. In a system with multiple servers, power may not be fully utilized in a server and another server may utilize power near but below an upper level. Some examples utilize a network interface device to reallocate power of a first platform to provide additional power to one or more other platforms while satisfying TDP of platforms.

At least to provide for dynamic power allocation to devices and nodes, one or more network interface devices can perform power management, fan control and quality of service (QoS)-based workload orchestration with or without blockchain based tracking of transactions at node, rack, or data center level. Based on QoS of a workload, one or more network interface devices can dynamically budget power allocated to compute engines (e.g., processors, CPUs, GPUs, FPGAs, XPUs, accelerators, etc.) to perform a workload among heterogenous computes engines. One or more network interface devices can manage power utilization at a rack or data center levels and can enable a node in a group of nodes to enter a turbo mode to operate at higher frequency and higher power usage.

Figure 6:
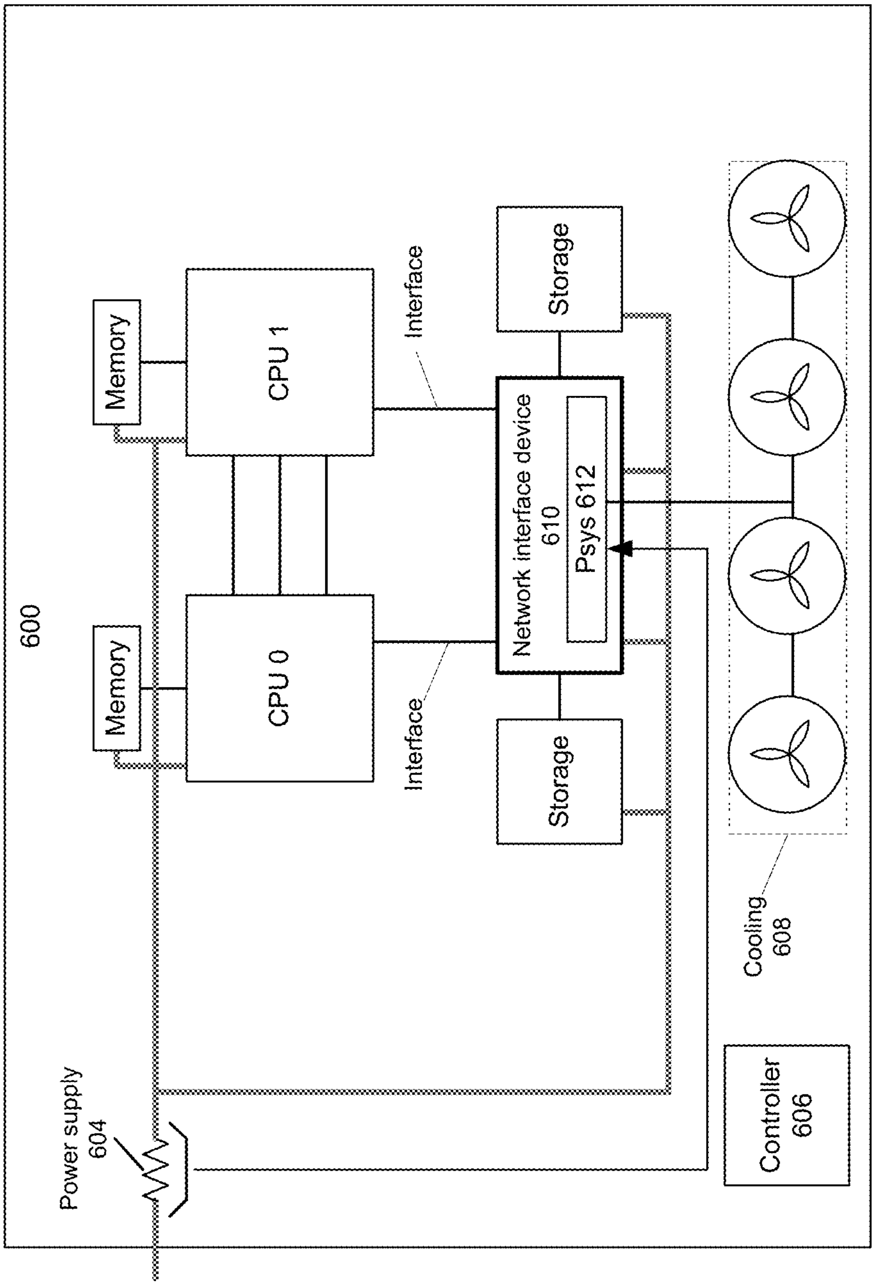
FIG. 6 depicts an example of network interface device managing power usage of compute engines when executing workloads and power usage.

FIG. 6 depicts an example of network interface device managing power usage of compute engines when executing workloads and power usage. Network interface device 610 can determine the total node power consumption from power supply 604. Network interface device 610 can control cooling emitted from cooling 608. Cooling can include one or more fans. Network interface device 610 can control air speed from one or more fans to cool or heat devices (e.g., CPU0, CPU1, one or more storages, or one or more memory devices). For example, network interface device 610 can set power usage and frequency of operation of CPU0 and CPU1 as well as other devices using communications via a PCIe interface.

Controller 606 (e.g., BMC) can control network interface device to not violate power allocation per node, per system, per rack and override allocation. Controller can identify cooling capabilities and know power capabilities. Controller 606 can turn off capability of Psys 612 to control power allocation to devices and can limit power range that Psys 612 can allocate.

Figure 7:
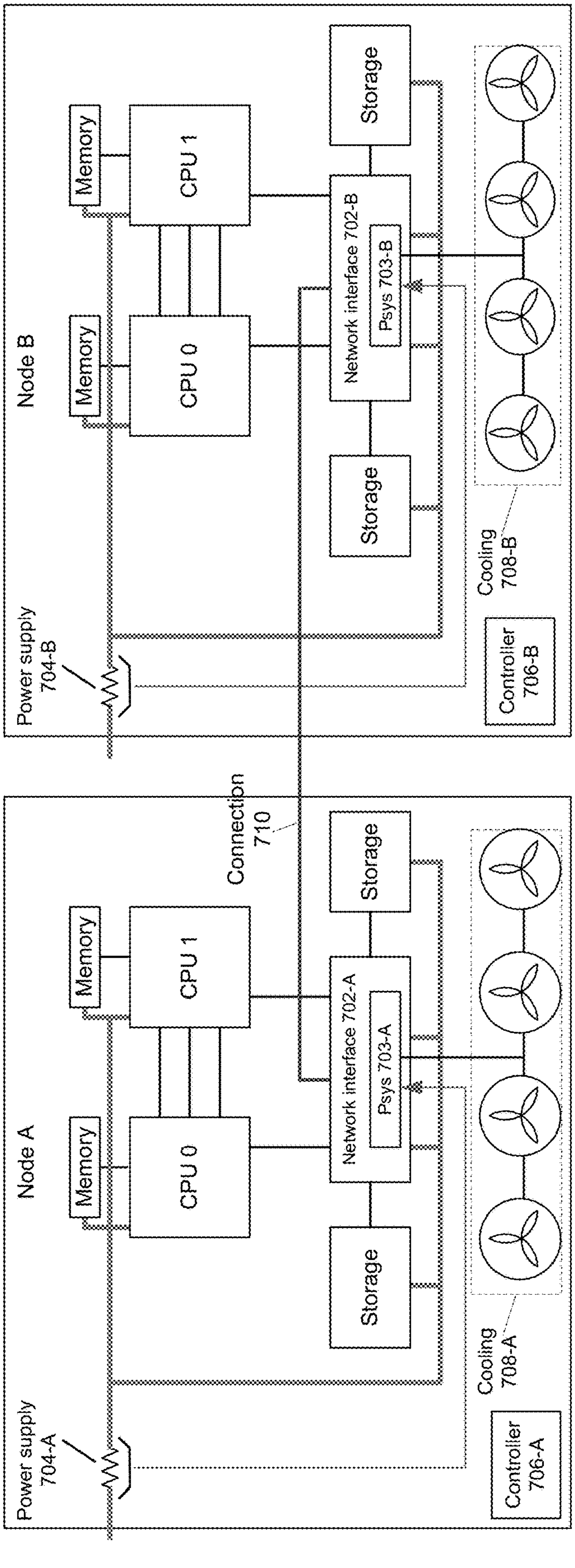
FIG. 7 depicts an example of power management of multiple nodes.

FIG. 7 depicts an example of power management of multiple nodes. Nodes A and B can be part of a rack of servers or nodes, and other nodes can be coupled to the rack. One or more of network interface devices 702-A and 702-B can monitor power consumption of different device on nodes A and B. Network interface devices 702-A and 702-B can include circuitry (e.g., Psys) to manage power and thermal budgets of CPU cores, GPUs, accelerators, ASICs, FPGAs, memory devices, and storage devices (and other devices) of a node based on available power among nodes A and B as well as based on QoS requirements of a workload. Network interface device 702-A and/or 702-B can perform hierarchical power management to manage node level power and thermal levels based on a power limit of a rack. In some cases, individual compute engines (e.g., CPU, GPU, FPGA, and so forth) can manage individual compute power consumption and thermal levels. Network interface device 702-A and/or 702-B can perform an orchestrator to assign workloads to devices on node A and/or node B and allocate power limits for node A and/or node B. In some examples, a publisher/subscriber model can be used, in which network interface device 702-A and/or 702-B can publish power limits, and a device (e.g., CPU, GPU, FPGA, and so forth) can limit its power consumption within power limits.

One or more trusted peer network interface devices 702-A and/or 702-B can perform power management at platform-level (e.g., node or rack level). Network interface device 702-A or 702-B can discover a trusted peer (e.g., 702-B or 702-A) and can securely validate trust credentials using provisioned credentials against a manifest provisioned in its respective controller (e.g., 706-A or 706-B) as well as in a fleet manager. A Psys of one or more network interface devices (e.g., 703-A or 703-B) can perform discovery and negotiation with other Psys systems. For example, based on discovered peer network interface devices' power management capabilities and power consumptions, one or more Psys can share power among nodes while remaining within the rack power limits.

In some examples, nodes A and B can exchange power consumption data via connection 710 (e.g., a network, fabric, interconnect, or bus). For example, one or more Psys (e.g., 703-A and/or 703-B) can determine power consumptions of Node A and Node B and as Node A consumes less power, the one or more Psys can permit Node B to enter a turbo mode to consume additional power provided that total power of Node A and Node B are within a rack power limits.

A Psys can perform run-time thermal and power headroom calculations at node, rack or data center level according to a policy set by a fleet manager. Psys can control fan speed of cooling (e.g., 708-A or 708-B) and number of active fans of cooling to control power usage by cooling. For example, 250-400 W of server power budget can be consumed by fans. In addition, Psys can control power consumed by devices as well as frequency of operation.

Controller 706-A can turn off capability of Psys 703-A to control power allocation to devices and can limit power range that Psys 703-A can allocate. Similarly, controller 706-B can turn off capability of Psys 703-B to control power allocation to devices and can limit power range that Psys 703-B can allocate.

Figure 8:
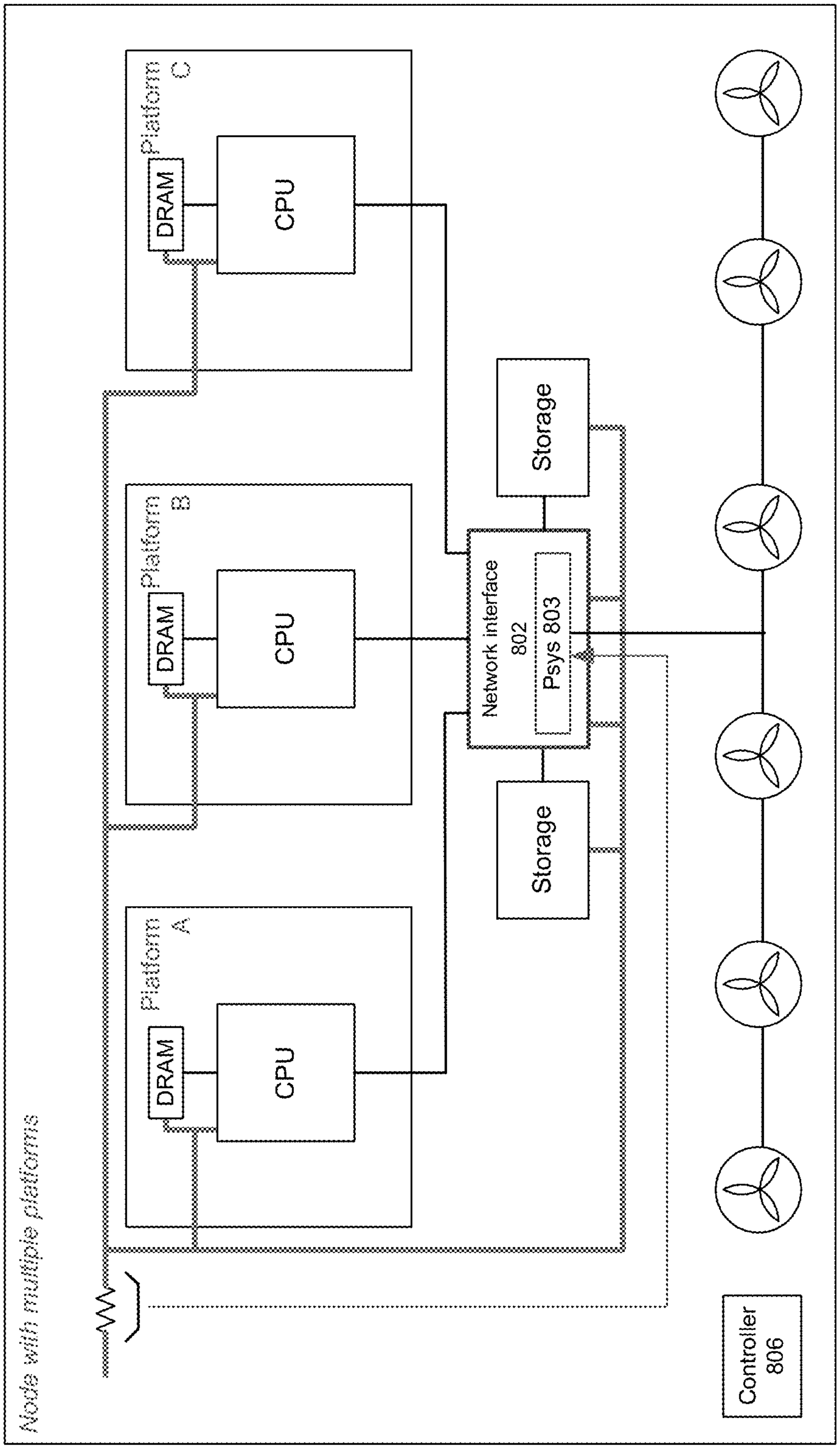
FIG. 8 depicts an example of a network interface device managing power usage of multiple platforms.

FIG. 8 depicts an example of a network interface device managing power usage of multiple platforms. In some examples, network interface device 802 can utilize Psys 803 to manage power consumption of platforms A, B, and/or C of a node and cooling of platforms A, B, and/or C. Psys 803 can monitor power consumption of the node, and based on power and thermal constraints of platforms A, B, and/or C, allocate power to platforms A, B, and/or C and control cooling of platforms A, B, and/or C. Psys 803 can allocate workloads based on QoS or service level agreement (SLA) requirements to platforms A, B, and/or C based on allocated power and cooling. Allocated power can correlate with processing performance and workloads with higher QoS or SLA requirements can be allocated to a platform with higher power and cooling allocations.

Controller 806 can turn off capability of Psys 803 to control power allocation to devices and can limit power range that Psys 803 can allocate.

Figure 9:
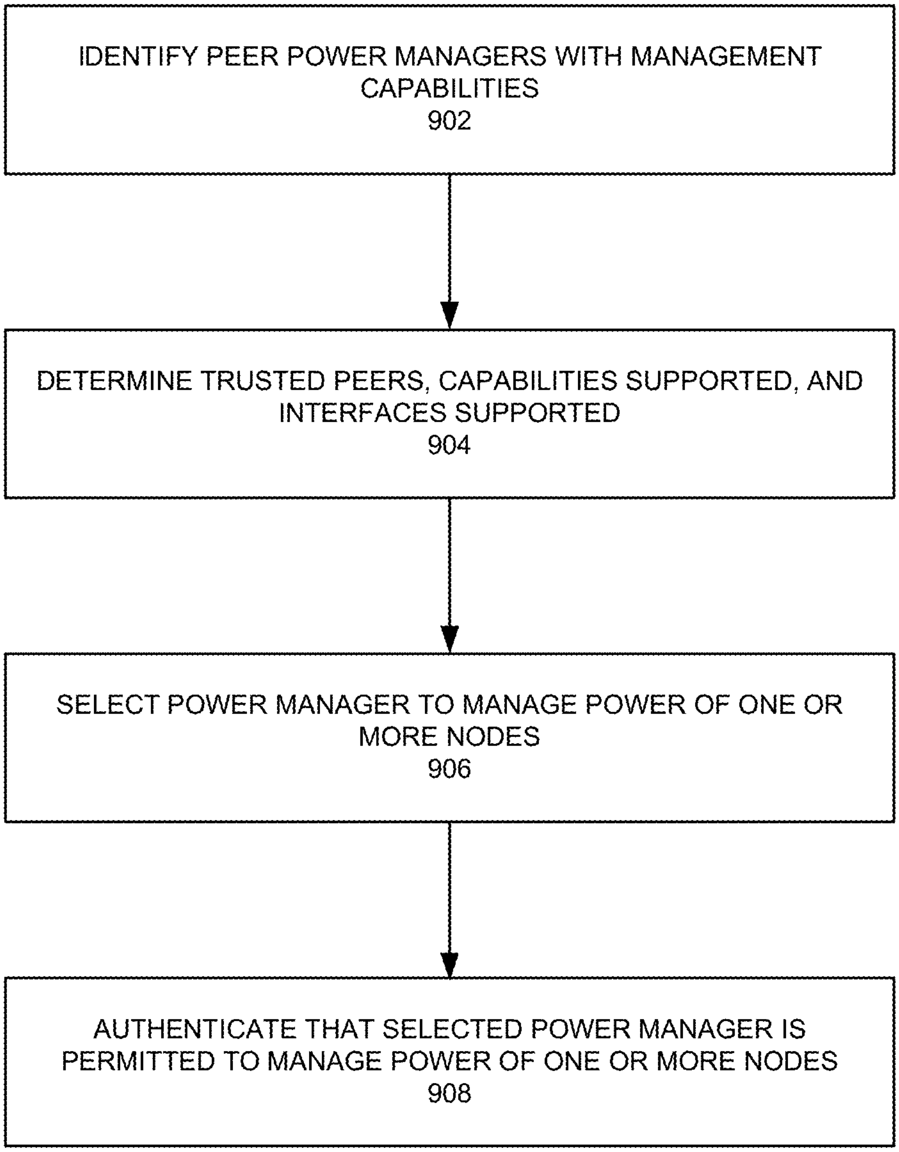
FIG. 9 depicts an example process.

FIG. 9 depicts an example process. The process can be performed by a controller and/or one or more power managers. In some examples, power managers can be implemented as part of a network interface device, or other circuitry such as a BMC or process executed by a microcontroller, central processing unit (CPU), graphics processing unit (GPU), or accelerator. At 902, one or more peer power managers can be identified. Identification of power managers can include sending requests in packets to different network interface devices to respond whether a power manager can manage power and temperature of a group of nodes or a group of platforms in one or more nodes. In some examples, power managers can be implemented as part of a network interface device, or other circuitry such as a BMC or process executed by a microcontroller, Power Control Unit (PCU), central processing unit (CPU), graphics processing unit (GPU), or accelerator.

At 904, trusted peer power managers can be identified as well as capabilities and interfaces supported by the trusted peer power managers. For example, a controller such as a BMC can determine whether identified power managers are trusted based on certificates, codes, or checksums received in responses from identified power managers. In some examples, a fleet manager can override the controller and enable or disable a power manager from participating in a power manager managing power for a group of nodes or a group of platforms in one or more nodes. A block chain based public ledger can be used to identify trusted power managers as part of an audit. A block chain based public ledger can track power negotiation transactions for audit and/or royalty purpose.

At 906, a power manager to manage power of a group of nodes or a group of platforms in one or more nodes can be selected. For example, selection of the power manager to manage power of a group of nodes or a group of platforms in one or more nodes can be based on a priority level of a power manager.

At 908, the selected power manager can be authenticated to determine if it is permitted to manage power of a group of nodes or a group of platforms in one or more nodes. For example, a controller can perform authentication based on policies or commands from a fleet manager. If the selected power manager is not permitted to manage power of a group of nodes or a group of platforms in one or more nodes, operations of 906 can be repeated to identify another power manager to manage power of a group of nodes or a group of platforms in one or more nodes.

Figure 10:
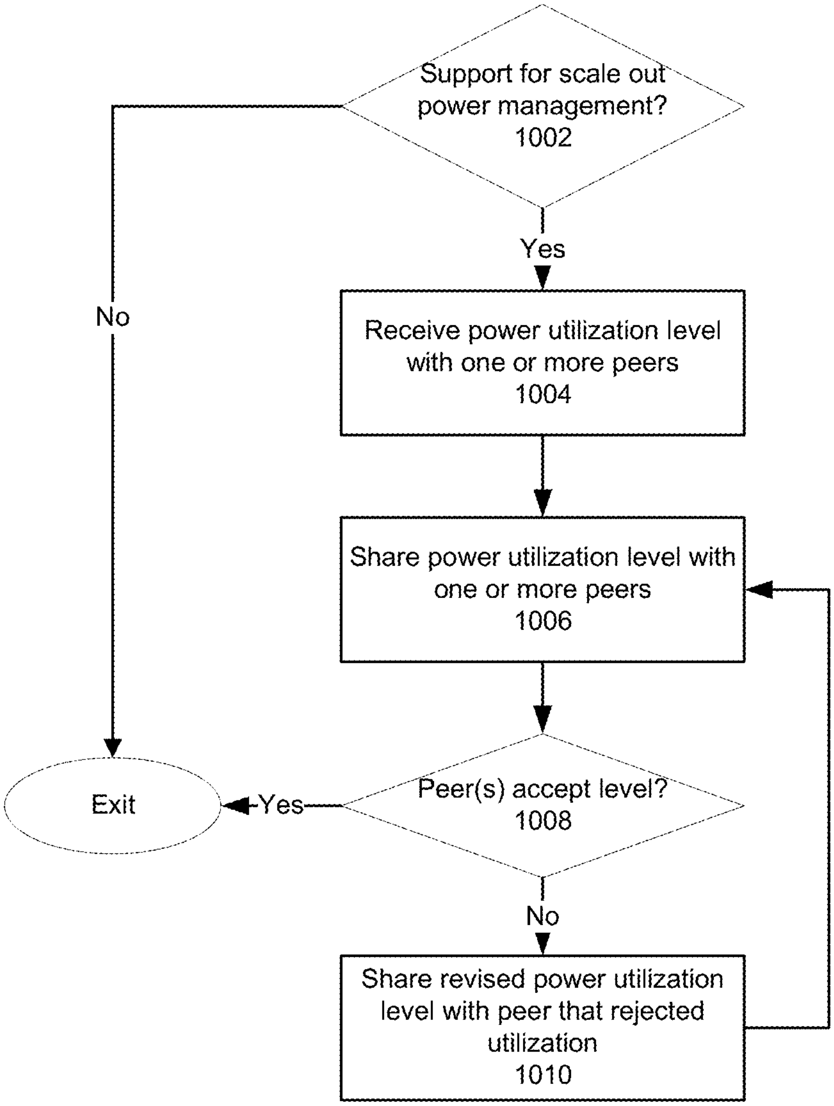
FIG. 10 depicts an example process.

FIG. 10 depicts an example process. The process can be performed by a power manager of a network interface device. At 1002, a determination can be made if the power manager is capable to perform power management of multiple nodes or platforms. Based on the power manager being capable to perform power management of multiple nodes or platforms, the process can proceed to 1004. Based on the power manager not being capable or permitted to perform power management of multiple nodes or platforms, the process can exit.

At 1004, the power manager can receive power levels from one or more peer power managers of different network interface devices. The power levels from one or more peer power managers of different network interface devices can be received from one or more nodes or one or more platforms.

At 1006, based on received power levels, the power manager can determine power levels to apply to one or more nodes or one or more platforms and indicate the power levels to apply to the one or more nodes or one or more platforms. For example, the power manager can be configured with a total power level allocated to multiple nodes and/or multiple platforms of a rack, data center, or other cluster of computing elements and based on the received power levels, determine available power (e.g., total power level−sum of received power levels) to allocate to one or more nodes and/or platforms. For example, based on a particular node including one or more devices executing a workload with a high priority QoS and available power, the power manager can allocate additional power to such particular node. The power manager of the particular node can be within or accessible to a network interface device and the power manager of the particular node can allocate additional power to the one or more devices that execute the workload with the high priority QoS.

In some examples, if a peer power manager rejects an indicated power level or does not participate in receiving power allocation from the power manager, the peer power manager can utilize static configured power management policies and enforce TDP within a node or platform based on available credits.

At 1008, the power manager can determine whether the indicated power levels were accepted for application by the peer one or more nodes or one or more platforms. For example, power managers of the peer one or more nodes or one or more platforms can communicate to the power manager to indicate acceptance or rejection of the indicated power level. In some examples, a rejection of a indicated power level can include a communication of a basis for rejection such as thermal limit violated or additional power requested. Based on rejection of the indicated power level, at 1010, the power manager can perform operations of 1006 to determine another power level that is higher or lower. For example, based on a basis for rejection of thermal limit violated, the power manager can determine and indicate a lower power level to the peer power manager that rejected the indicated power level. For example, based on a basis for rejection of additional power requested, the power manager can determine and indicate a higher power level to the peer power manager that rejected the indicated power level.

Power Density and Die Temperature Profile Emulation of Workloads

Assessing feasibility power and thermal conditions of a device and platform can be a challenge without an actual workload, for example, for network interface cards such as Infrastructure Processing Units. The exact workloads that are run on the FPGA and the CPU on an Infrastructure Processing Unit are evolving, and hence predicting a power and thermal profile on the device becomes a challenge. For example, a system that includes a Power and Thermal Emulation Orchestrator (PTEO), running on a network interface device, can determine an emulation of system power and thermal distribution or bounding boxes for a device. PTEO can receive input vectors as temperature map or power density map of a device die and provide an output of emulated power density or temperature map respectively. To perform power and thermal emulation, based on a user input of estimated temperature profile across a die or dies, PTEO can determine and indicate power levels achievable staying within the temperature bounds. Based on user input of an estimated power density across a die or dies, PTEO can determine temperature profile across the die or dies.

In some examples, PTEO can control a Configurable Power Load (CPL) in a closed loop to simulate system level temperature profile and power density. PTEO can provide an output of spatial positions and utilization factor of Fabric Power Load (FPL) modules on a device that executes a workload. A workload can include one or more processes or operations that are performed. PTEO can perform emulation based on temperature maps and iterative FPL utilization.

PTEO can determine traffic modulation based on workload properties. The emulation of power and thermal distributed can be used to potentially adjust utilization of components of a device. Device designers, customers, or others can utilize the emulation to determine power density impact and thermal distribution of a device design and potentially adjust the device design to adjust power and/or thermal levels.

The device can include a network interface device, accelerator, CPU, GPU, memory devices, storage devices, IPU Add-In-Card platform, or IPU MCPs distributed across an FPGA fabric, DPA, and system on chip (SoC) with one or multiple of the preceding.

PTEO can be implemented as a combination of software, firmware, and runtime logic (RTL). PTEO can include an orchestrator and firmware (e.g., RTL images, Power Virus (e.g., stressor of processor), etc.) and execute on the device for which an emulation takes place or another device. In some examples, Intel® Open FPGA Stack (IOFS) can include PTEO.

PTEO can enable system design power and thermal analysis to define device resources utilization boundary even without a prototype device executing a workload. The PTEO can allow device customers to study power densities and thermal performances, without building prototype boards and workload designs and save costs arising from development efforts in building prototype devices. Designers can modify power management of devices based on temperature distribution studies on MCP and perform dynamic power budgeting across different devices in a system. PTEO can provide an ability for deployment time thermal and power validation of devices in a datacenter server fleet for fast-paced checking of the intended power and thermal performance of each deployed devices and identify early failure as well as potentially increased accuracy of Total Cost of Ownership (TCO) prediction.

Figure 11:
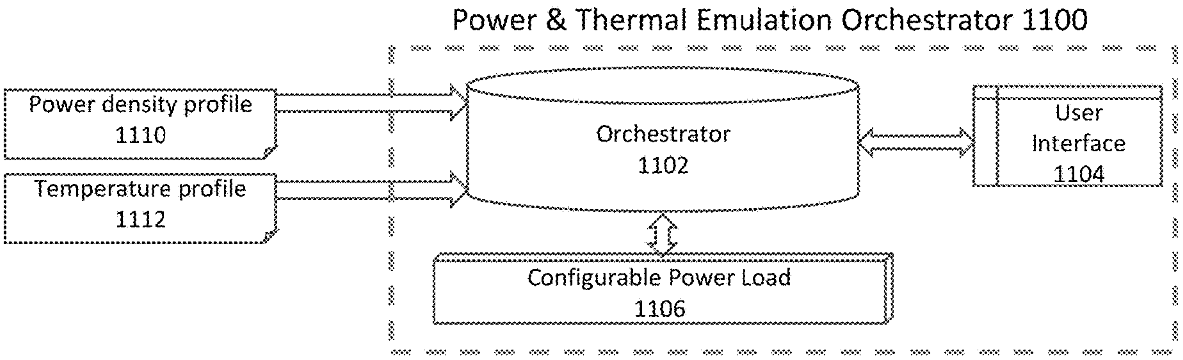
FIG. 11 depicts an example of a system.

FIG. 11 depicts an example of a system. PTEO can include a combination of software, firmware and hardware that interact to emulate a workload power profile on a platform without actually having the final synthesizable workload design. Orchestrator 1102 can receive inputs of power density profile 1110 and/or temperature profile 1112 of a device and based on a configurable power load 1106, provide an emulation of power density or temperature map of a device. User interface 1104 can display the emulation of power density or temperature map of a device, in some examples, or such emulation can be stored in memory as an image or file.

Figure 12:
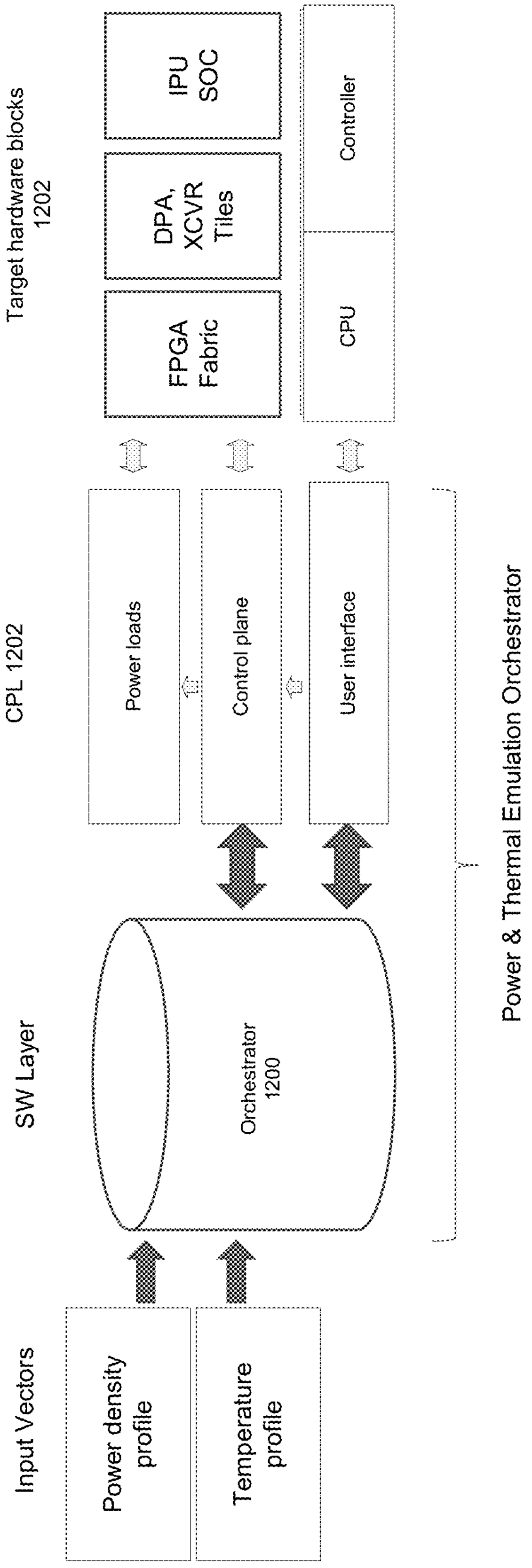
FIG. 12 depicts an example system.

FIG. 12 depicts an example system. Orchestrator 1200 can perform emulation based on power density and/or thermal profile that is input from a Quartus tool by controlling Configurable Power Load (CPL). CPL 1202 can include a combination of power loads and control plane and a user interface that run on the target hardware blocks of a system under test. CPL 1202 can be implemented as firmware and/or RTL. Target hardware blocks 1292 can include hardware blocks of a target system that execute power loads to emulate the workload power/thermal profile. Blocks can include FPGA fabric, DPA, transceiver (XCVR) tiles, and IPU system on chip, CPU, controller (e.g., BMC), among others.

Figure 13:
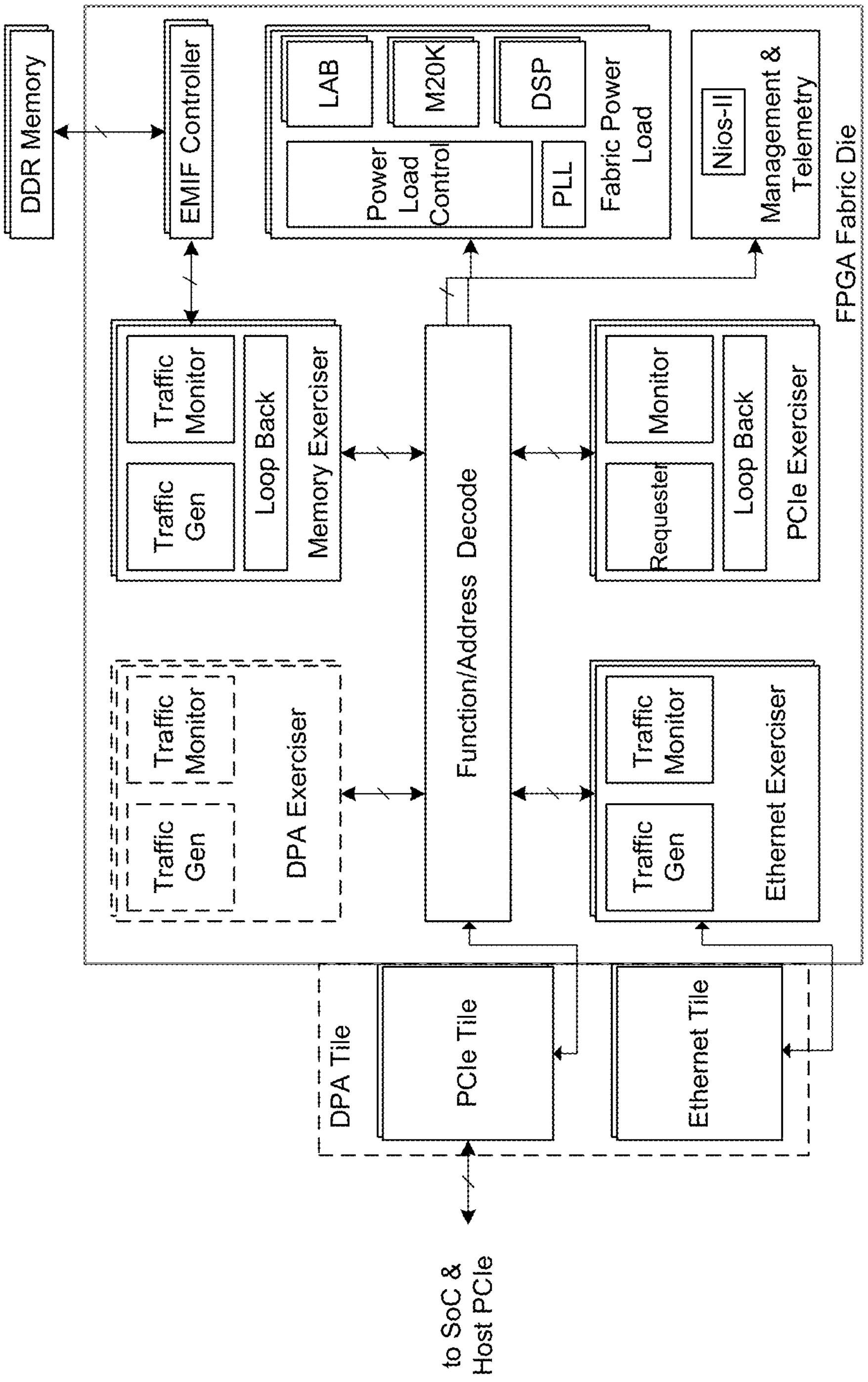
FIG. 13 depicts an example device system.

FIG. 13 depicts an example device system. In some examples, traffic generation (Gen), Traffic monitor, Requester, Monitor, loop back, power load control, LAB, M20K, DSP, and Nios-II can be implemented as part of CPL RTL and firmware.

Figure 14:
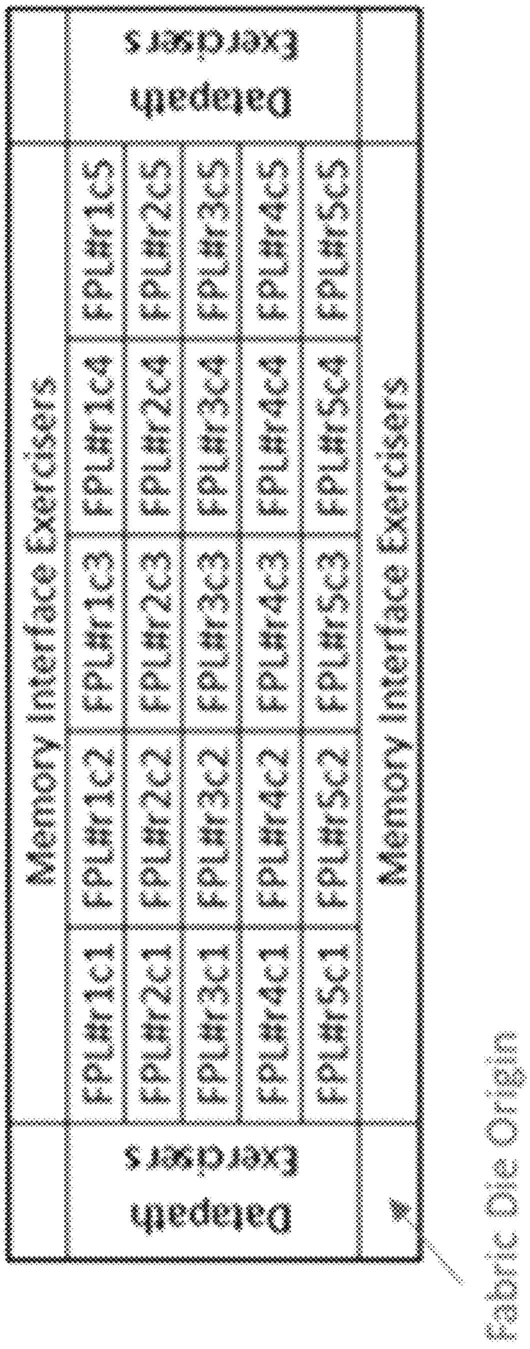
FIG. 14 depicts an example system of a partitioned fabric power load (FPL) with exercisers.

FIG. 14 depicts an example system of a partitioned fabric power load (FPL) with exercisers. Fabric dies can be virtually divided into spatially partitioned rows and columns-based sectors. The groups of resources can include Logic Elements, Embedded Memory Blocks, Clock resources form the Power Load module in that sector. Certain sectors of the Fabric Die can be allocated for interface exercisers, such as External Memory Interface (EMIF) exercisers and Cross-die datapath exercisers.

Datapath exercisers can emulate a work load's power consumption on external data path interfaces such as PCIe, Ethernet, Memory, DPA tile data path etc. Exercisers can generate traffic and mimic work load's datapath traffic profiles. A workload aware network exercisers can be programmed to emulate burstiness of packets based on use case. For example, in a Virtual RAN application, these exercisers can emulate user equipment to base station dataflow statistics to enable the emulation to consider a real word workload scenario.

A workload aware memory exerciser can be configurable based on parameters such as memory clock frequency, address split, data width, ECC, IME, read/write bandwidth, page hit ratio, burst length, traffic data pattern etc. By adjusting such parameters, a load's memory interface power consumption can be emulated.

CPL power load modules can cause issuance of power to an MCP. Different power loads can be applied to different dies. In some examples, Partitioned Fabric Power Load modules (FPL) can receive power loads. Locations of FPL modules can be configured in the orchestrator to load locations of FPLs. Locations of FPL modules can be indexed by row "r" and column "c." FPL modules can provide an interface to the control plane to configure activity factor, clock and data toggle rate as a few example to control power dissipation by the module. A single power load module can be a subdivision of more granular smaller power load cells to gain better control on power loading levels. Power consumption of an FPL can be controlled by clock gating activity.

When workloads run, some FPL have higher temperature activity than others. Activity of FPLs can be emulated and temperature differences measured across a die or package. CPL can determine a temperature profile for the FPLs by providing power uniformly or non-uniformly to FPLs.

Emulation based on iterative FPL excitation and loading can be based on an input of temperature profile with an output of a power density to apply to a device achieve such temperature profile; an input of power density with an output of temperature profile across a cooling capability curve to apply to a device to achieve such a power density; or an input of a combination of power density and acceptable temperature profile for the device with an output of power density profile to apply to a device for a temperature bound.

Figure 15:
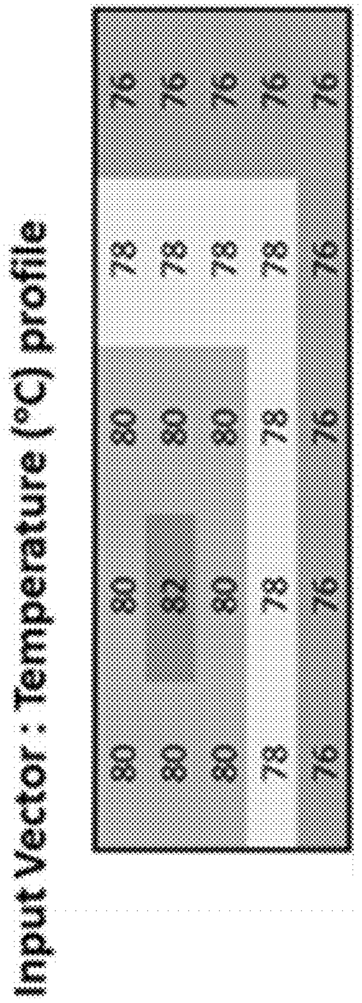
FIG. 15 depicts an example of an input vector of a temperature map on the device executing a workload.

FIG. 15 depicts an example of an input vector of a temperature map on the device executing a workload. For example, the input vector can be provided by a customer or provided from a tool simulation. An output could include achievable power levels of the system to stay within the temperature bounds. In this example, temperature and power levels are for a fabric die only, but the loading can be performed for other exercisers loading other peripheral devices and dies.

The output can be used to determine if power density is different than expected and customer can change distribution of a workload on a die.

Various manners of determining the output of achievable power levels of the system are described. In some examples, based on a characterized heat sink solution (e.g., where the heat sink cooling curve is known), temperature superposition can used whereby for a package, an influence matrix (ICM) can be calculated across the entire package which defines the impact of temperature on locations. Based on the ICM, the temperature profile, and the heat sink design, a power map can be calculated that specifies the target power for sections of the die.

In some examples, powers can be applied iteratively until the desired temperature profile is achieved to emulate power. Orchestrator can perform a closed loop system between the CPL Power Load Modules and CPL telemetry to achieve a steady state temperature profile as indicated by the input vector.

Emulation can be applied in a Multi-Die system, as well as heterogeneous systems where there are FPGA dies, processor dies, accelerator dies, memory devices, storage devices, or other circuitry. Orchestrator can perform the closed loop control to determine desired power and/or temperature density.

Figure 16:
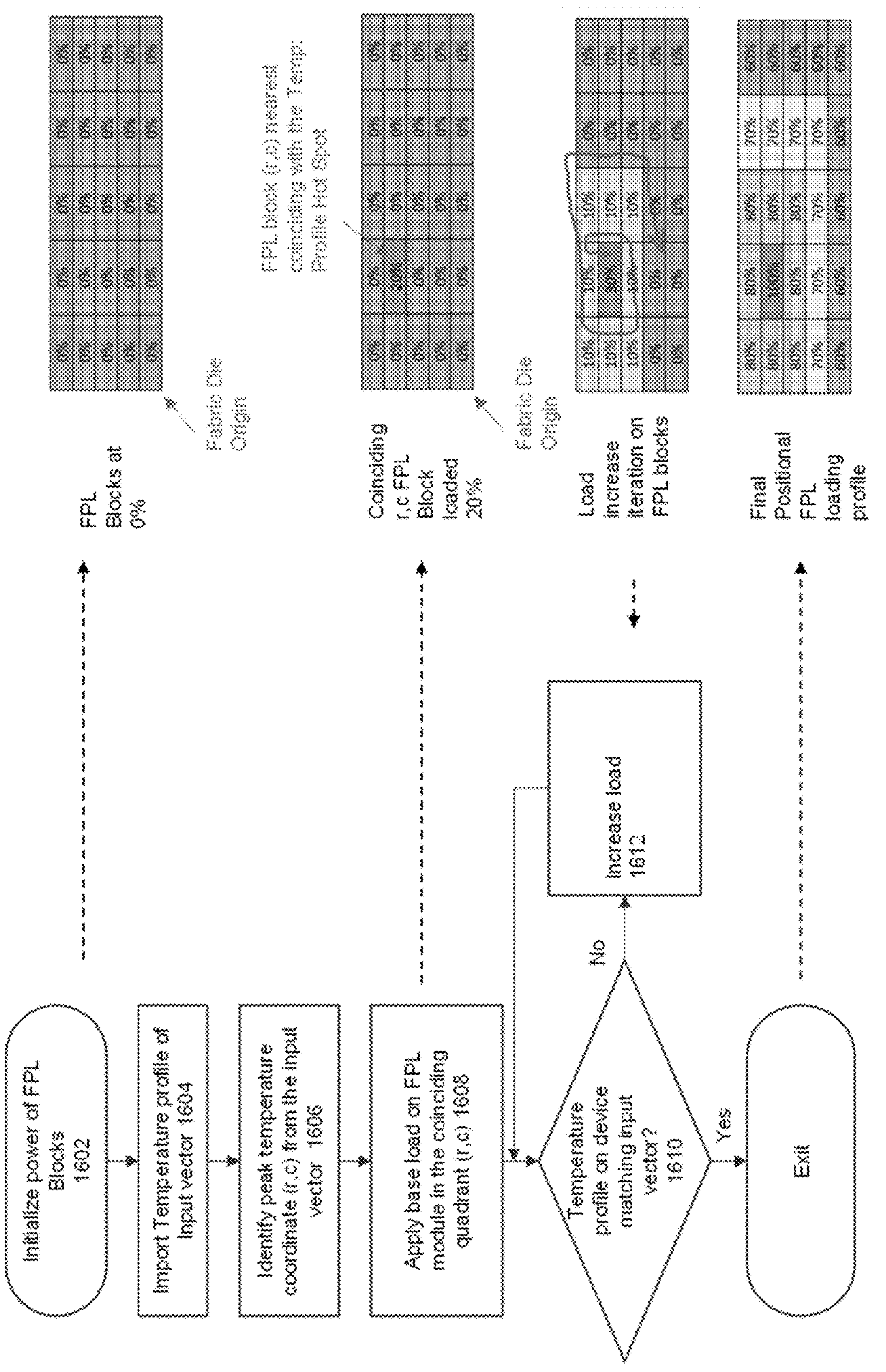
FIG. 16 depicts an example of a closed loop emulation based on an input of a temperature profile.

FIG. 16 depicts an example of a closed loop emulation based on an input of a temperature profile. At 1602, power applied to FPL blocks can be initialized. In some examples, power applied to FPL blocks can be initialized to zero or another value. At 1604, a temperature profile of an input vector can be imported or received. At 1606, a peak temperature coordinates in the temperature profile can be identified. At 1608, a power load can be applied to the FPL module corresponding to the peak temperature coordinates. At 1610, a determination can be made as to whether a temperature profile on the device matches that of the input vector. Based on the temperature profile on the device matches that of the input vector, the process can exit. Based on the temperature profile on the device matches that of the input vector, the process can proceed to 1612. At 1612, the power load on the peak temperature coordinates and adjacent coordinates can be increased. For example, load on coinciding FPL module and immediate adjacent FPL modules can be increased. FPL modules further from the peak temperature coordinates can be selected and loaded as iterations of 1612 increase.

In examples where an input to CPL is a power density profile of the workload, CPL converts the power density profile to an FPL load excitation profile, applies the FPL excitation profile to emulate the power loading on the die and consequently generates a temperature profile developing across the die. In some examples, the CPL can sweep the fan speed to develop a cooling capacity curve for the die for the specified workload. A customer can design heat sink based on the output temperature profile.

Figure 17A:
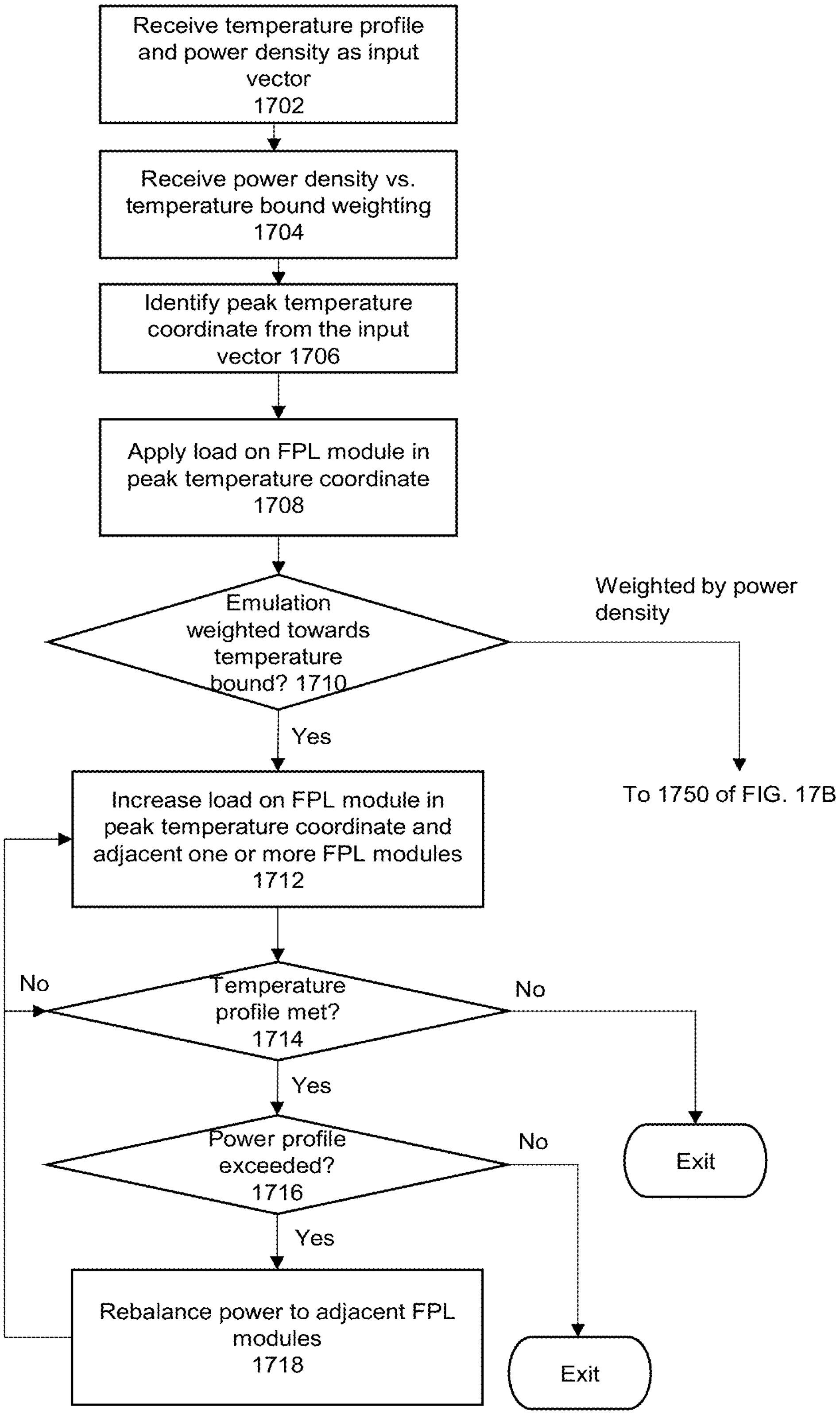
FIGS. 17A and 17B depict example process to perform emulation based on power density and temperature profile.
Figure 17B:
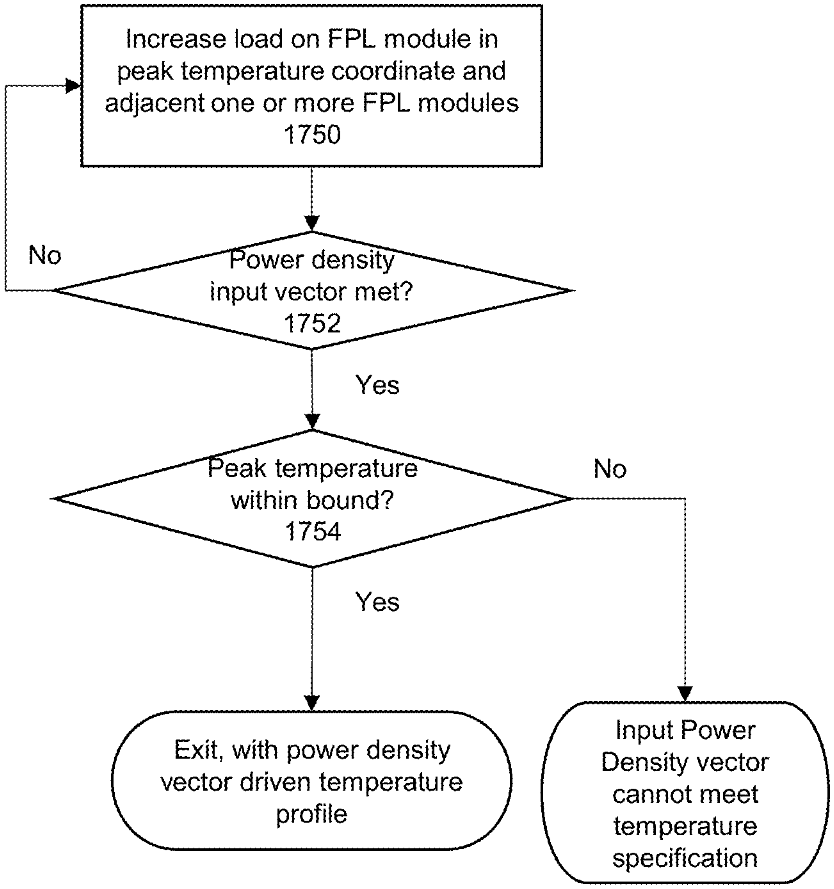

FIGS. 17A and 17B depict example process to perform emulation based on power density and temperature profile. For example, a CPU can perform the operations of FIGS. 17A and 17B. Referring to FIG. 17A, at 1702, a temperature profile and power density profile can be received as an input vector. The temperature profile and power density profile can indicate temperature and power consumed by different portions of a device. Input is combination of maximum acceptable power density and maximum acceptable temperature profile for the device, output will be the optimum power density profile for best fit the temperature bound. The input includes peak power densities not to be exceeded at locations of the die and peak temperature not to be exceeded at different locations of the die. At 1704, a power density versus temperature bound weighting can be received. The power density versus temperature bound weighting can indicate whether to weigh temperature or power more heavily. The weighting can indicate how much to skew towards power density or temperature bound as a priority. At 1706, a peak temperature or temperatures can be identifies from the temperature profile. At 1708, a load can be applied to portion of a device corresponding to one or more FPL modules that coincide with coordinates associated with the peak temperature. The load can include application of power.

At 1710, a determination can be made if the weighting is towards temperature bound or power density. Based on the weighting being towards complying with temperature bound, the process can proceed to 1712. Based on the weighting being towards complying with power density, the process can proceed to 1750 of FIG. 17B.

At 1712, a load on the FPL module(s) corresponding to the peak temperature coordinates can be increased as well as the loads on immediately adjacent FPL modules. As iterations of 1712 increase, the loads can be applied to FPL modules even further from the FPL module(s) corresponding to the peak temperature coordinates. At 1714, a determination can be made of whether the temperature profile of regions of the device are met. If the temperature profile of regions of the device are met, the process can proceed to 1716. If the temperature profile of regions of the device are not met, the process can exit and an indication can be made in a file or via a user interface that the temperature profile cannot be met.

At 1716, a determination can be made of whether the power profile of regions of the device are exceeded. A power profile can refer to peak power that can be applied to one or more regions of a device. If the power profile of one or more regions of the device are not exceeded, the process can exit and provide a power profile that meets thermal bounds. If the power profile of one or more regions of the device are exceeded, the process can proceed to 1718. At 1718, power load applied to adjacent FPL module(s) can be adjusted to reduce power to the one or more regions of the device for which power is exceeded and the process can proceed to 1712.

Referring to FIG. 17B, at 1750, a load on the FPL module(s) corresponding to the peak temperature coordinates can be increased as well as the loads on immediately adjacent FPL modules. As iterations of 1750 increase, the power load can be applied to FPL modules even further from the FPL module(s) corresponding to the peak temperature coordinates. At 1752, a determination can be made of whether the power density input vector of the device are met. If the power density vector profile of regions of the device are met, the process can proceed to 1754. If the power density vector profile of regions of the device are not met, the process can return to 1750 for another iteration.

At 1754, a determination can be made of whether the peak temperature of regions of the device is within a bound specified by the temperature profile vector. If the peak temperature of regions of the device are within a bound specified by the temperature profile vector, the process can exit and provide a temperature profile that satisfies the power density vector. If the peak temperature of regions of the device exceed a bound specified by the temperature profile vector, the process can exit and indicate that power density cannot satisfy the temperature profile vector.

Figure 18:
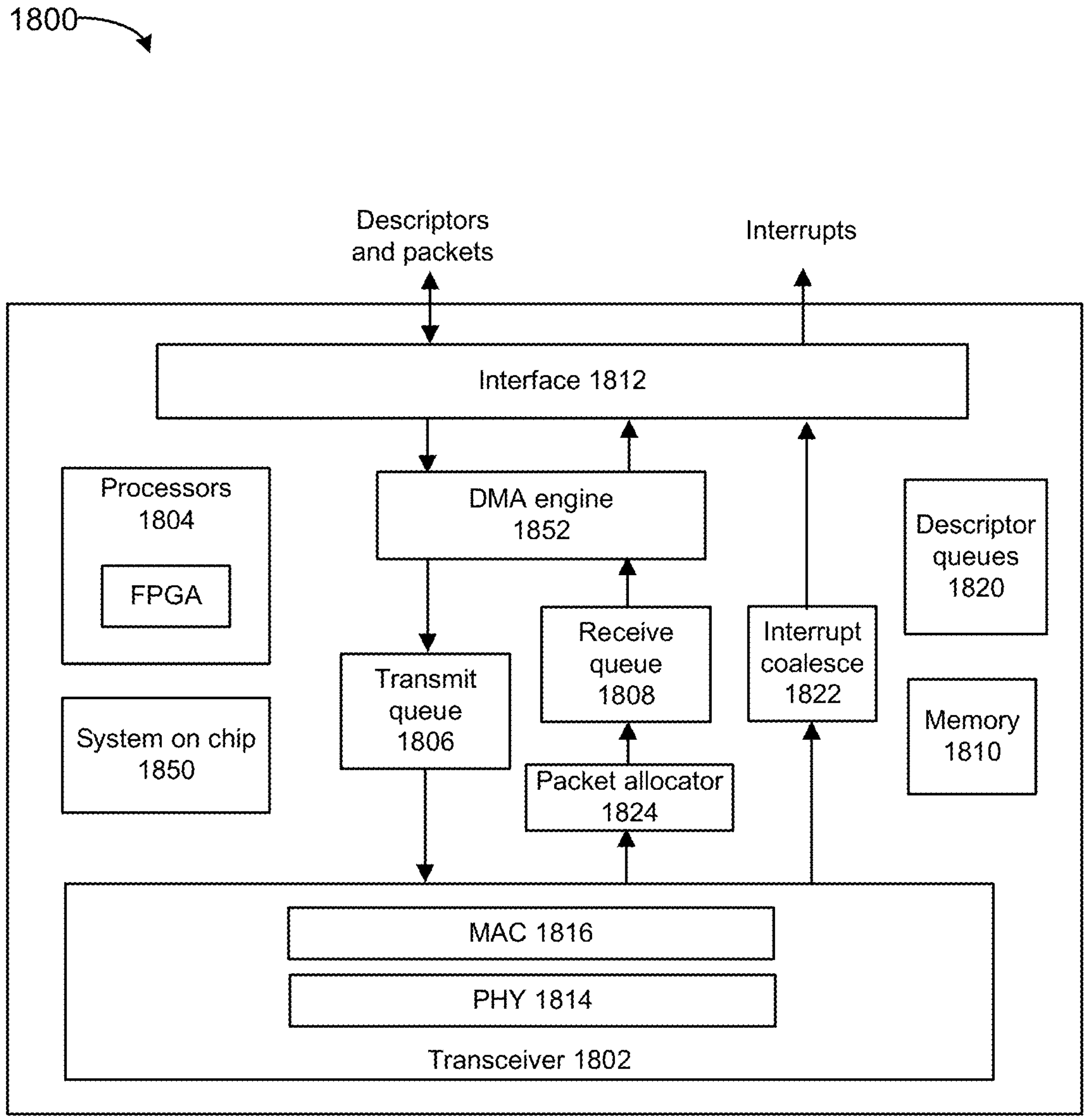
FIG. 18 depicts an example network interface device.

FIG. 18 depicts an example network interface device or packet processing device. In some examples, the packet processing device can be programmed to adjust power applied by one or more nodes or platforms and/or control cooling of devices, as described herein. In some examples, packet processing device 1800 can be implemented as a network interface controller, network interface card, a host fabric interface (HFI), or host bus adapter (HBA), and such examples can be interchangeable. Packet processing device 1800 can be coupled to one or more servers using a bus, PCIe, CXL, or DDR. Packet processing device 1800 may be embodied as part of a system-on-a-chip (SoC) that includes one or more processors, or included on a multichip package that also contains one or more processors.

Some examples of packet processing device 1800 are part of an Infrastructure Processing Unit (IPU) or data processing unit (DPU) or utilized by an IPU or DPU. An xPU can refer at least to an IPU, DPU, GPU, GPGPU, or other processing units (e.g., accelerator devices). An IPU or DPU can include a network interface with one or more programmable or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices.

Network interface 1800 can include transceiver 1802, processors 1804, transmit queue 1806, receive queue 1808, memory 1810, and bus interface 1812, and DMA engine 1852. Transceiver 1802 can be capable of receiving and transmitting packets in conformance with the applicable protocols such as Ethernet as described in IEEE 802.3, although other protocols may be used. Transceiver 1802 can receive and transmit packets from and to a network via a network medium (not depicted). Transceiver 1802 can include PHY circuitry 1814 and media access control (MAC) circuitry 1816. PHY circuitry 1814 can include encoding and decoding circuitry (not shown) to encode and decode data packets according to applicable physical layer specifications or standards. MAC circuitry 1816 can be configured to assemble data to be transmitted into packets, that include destination and source addresses along with network control information and error detection hash values.

Processors 1804 can be any a combination of a: processor, core, graphics processing unit (GPU), field programmable gate array (FPGA), application specific integrated circuit (ASIC), or other programmable hardware device that allow programming of network interface 1800. For example, a "smart network interface" can provide packet processing capabilities in the network interface using processors 1804.

Processors 1804 can include one or more packet processing pipeline that can be configured to perform match-action on received packets to identify packet processing rules and next hops using information stored in a ternary content-addressable memory (TCAM) tables or exact match tables in some embodiments. For example, match-action tables or circuitry can be used whereby a hash of a portion of a packet is used as an index to find an entry. Packet processing pipelines can perform one or more of: packet parsing (parser), exact match-action (e.g., small exact match (SEM) engine or a large exact match (LEM)), wildcard match-action (WCM), longest prefix match block (LPM), a hash block (e.g., receive side scaling (RSS)), a packet modifier (modifier), or traffic manager (e.g., transmit rate metering or shaping). For example, packet processing pipelines can implement access control list (ACL) or packet drops due to queue overflow.

Configuration of operation of processors 1804, including its data plane, can be programmed based on one or more of: one or more of: Protocol-independent Packet Processors (P4), Software for Open Networking in the Cloud (SONiC), Broadcom® Network Programming Language (NPL), NVIDIA® CUDA®, NVIDIA® DOCA™, Data Plane Development Kit (DPDK), OpenDataPlane (ODP), Infrastructure Programmer Development Kit (IPDK), x86 compatible executable binaries or other executable binaries, or others. Processors 1804 and/or system on chip 1850 can execute instructions to control power applied by one or more nodes or platforms and/or control cooling of devices, as described herein.

Packet allocator 1824 can provide distribution of received packets for processing by multiple CPUs or cores using timeslot allocation described herein or RSS. When packet allocator 1824 uses RSS, packet allocator 1824 can calculate a hash or make another determination based on contents of a received packet to determine which CPU or core is to process a packet.

Interrupt coalesce 1822 can perform interrupt moderation whereby network interface interrupt coalesce 1822 waits for multiple packets to arrive, or for a time-out to expire, before generating an interrupt to host system to process received packet(s). Receive Segment Coalescing (RSC) can be performed by network interface 1800 whereby portions of incoming packets are combined into segments of a packet. Network interface 1800 provides this coalesced packet to an application.

Direct memory access (DMA) engine 1852 can copy a packet header, packet payload, and/or descriptor directly from host memory to the network interface or vice versa, instead of copying the packet to an intermediate buffer at the host and then using another copy operation from the intermediate buffer to the destination buffer.

Memory 1810 can be any type of volatile or non-volatile memory device and can store any queue or instructions used to program network interface 1800. Transmit queue 1806 can include data or references to data for transmission by network interface. Receive queue 1808 can include data or references to data that was received by network interface from a network. Descriptor queues 1820 can include descriptors that reference data or packets in transmit queue 1806 or receive queue 1808. Bus interface 1812 can provide an interface with host device (not depicted). For example, bus interface 1812 can be compatible with PCI, PCI Express, PCI-x, Serial ATA, and/or USB compatible interface (although other interconnection standards may be used).

Figure 19:
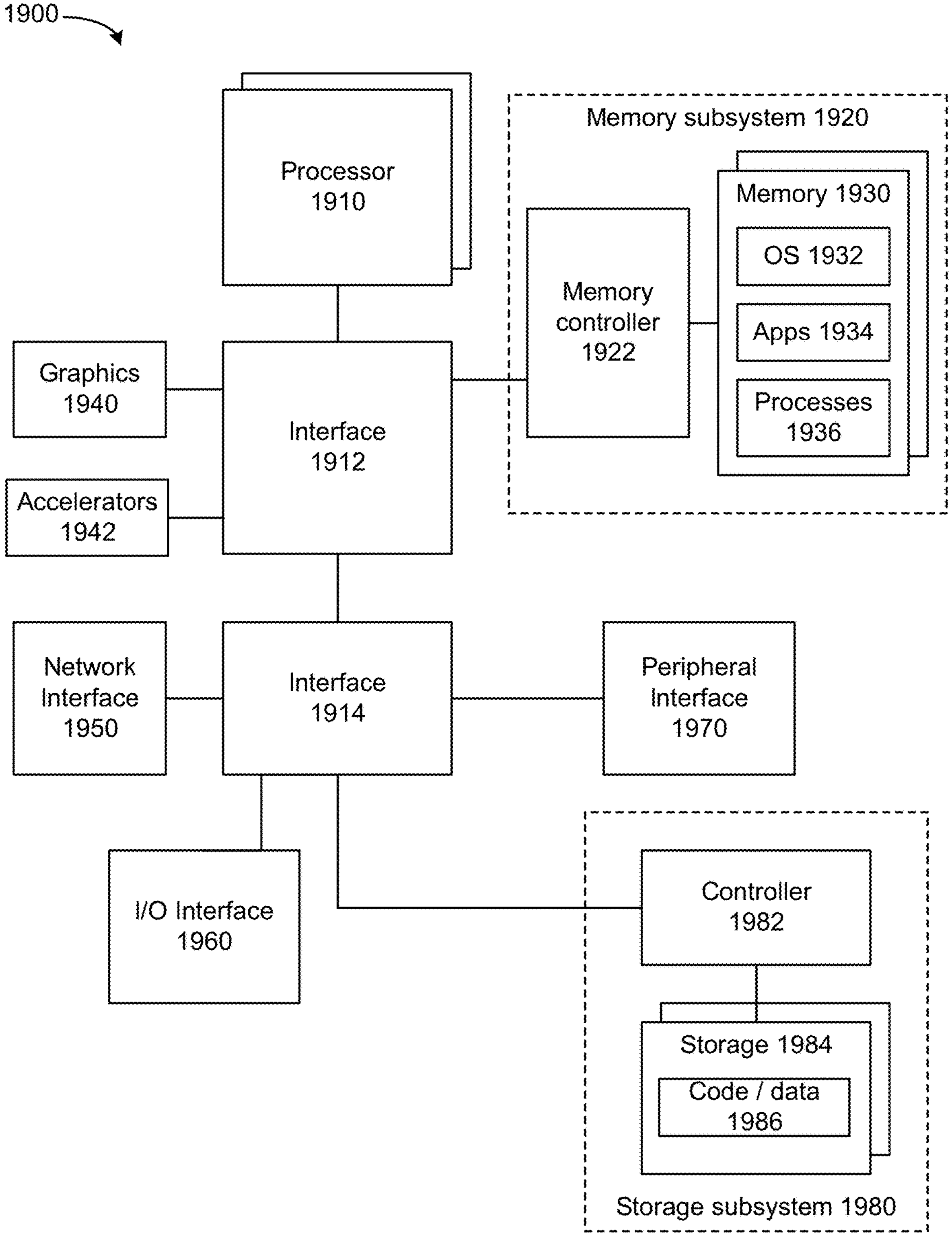
FIG. 19 depicts an example system.

FIG. 19 depicts a system. The system can be included in a server and in a data center. In some examples, operation of programmable pipelines of network interface 1950 can configured using a recirculated packet, as described herein. System 1900 includes processor 1910, which provides processing, operation management, and execution of instructions for system 1900. Processor 1910 can include any type of microprocessor, central processing unit (CPU), graphics processing unit (GPU), XPU, processing core, or other processing hardware to provide processing for system 1900, or a combination of processors. An XPU can include one or more of: a CPU, a graphics processing unit (GPU), general purpose GPU (GPGPU), and/or other processing units (e.g., accelerators or programmable or fixed function FPGAs). Processor 1910 controls the overall operation of system 1900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1900 includes interface 1912 coupled to processor 1910, which can represent a higher speed interface or a high throughput interface for system components that needs higher bandwidth connections, such as memory subsystem 1920 or graphics interface components 1940, or accelerators 1942. Interface 1912 represents an interface circuit, which can be a standalone component or integrated onto a processor die. Where present, graphics interface 1940 interfaces to graphics components for providing a visual display to a user of system 1900. In one example, graphics interface 1940 can drive a display that provides an output to a user. In one example, the display can include a touchscreen display. In one example, graphics interface 1940 generates a display based on data stored in memory 1930 or based on operations executed by processor 1910 or both. In one example, graphics interface 1940 generates a display based on data stored in memory 1930 or based on operations executed by processor 1910 or both.

Accelerators 1942 can be a programmable or fixed function offload engine that can be accessed or used by a processor 1910. For example, an accelerator among accelerators 1942 can provide data compression (DC) capability, cryptography services such as public key encryption (PKE), cipher, hash/authentication capabilities, decryption, or other capabilities or services. In some embodiments, in addition or alternatively, an accelerator among accelerators 1942 provides field select controller capabilities as described herein. In some cases, accelerators 1942 can be integrated into a CPU socket (e.g., a connector to a motherboard or circuit board that includes a CPU and provides an electrical interface with the CPU). For example, accelerators 1942 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 1942 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models to perform learning and/or inference operations.

Memory subsystem 1920 represents the main memory of system 1900 and provides storage for code to be executed by processor 1910, or data values to be used in executing a routine. Memory subsystem 1920 can include one or more memory devices 1930 such as read-only memory (ROM), flash memory, one or more varieties of random access memory (RAM) such as DRAM, or other memory devices, or a combination of such devices. Memory 1930 stores and hosts, among other things, operating system (OS) 1932 to provide a software platform for execution of instructions in system 1900. Additionally, applications 1934 can execute on the software platform of OS 1932 from memory 1930. Applications 1934 represent programs that have their own operational logic to perform execution of one or more functions. Processes 1936 represent agents or routines that provide auxiliary functions to OS 1932 or one or more applications 1934 or a combination. OS 1932, applications 1934, and processes 1936 provide software logic to provide functions for system 1900. In one example, memory subsystem 1920 includes memory controller 1922, which is a memory controller to generate and issue commands to memory 1930. It will be understood that memory controller 1922 could be a physical part of processor 1910 or a physical part of interface 1912. For example, memory controller 1922 can be an integrated memory controller, integrated onto a circuit with processor 1910.

In some examples, OS 1932 can enable or disable power manager operations from being performed by network interface 1950 or other processor or circuitry. For example, the power manager can adjust power applied by one or more nodes or platforms and/or control cooling of devices.

Applications 1934 and/or processes 1936 can refer instead or additionally to a virtual machine (VM), container, microservice, processor, or other software. Various examples described herein can perform an application composed of microservices, where a microservice runs in its own process and communicates using protocols (e.g., application program interface (API), a Hypertext Transfer Protocol (HTTP) resource API, message service, remote procedure calls (RPC), or Google RPC (gRPC)). Microservices can communicate with one another using a service mesh and be executed in one or more data centers or edge networks. Microservices can be independently deployed using centralized management of these services. The management system may be written in different programming languages and use different data storage technologies. A microservice can be characterized by one or more of: polyglot programming (e.g., code written in multiple languages to capture additional functionality and efficiency not available in a single language), or lightweight container or virtual machine deployment, and decentralized continuous microservice delivery.

A virtualized execution environment (VEE) can include at least a virtual machine or a container. A virtual machine (VM) can be software that runs an operating system and one or more applications. A VM can be defined by specification, configuration files, virtual disk file, non-volatile random access memory (NVRAM) setting file, and the log file and is backed by the physical resources of a host computing platform. A VM can include an operating system (OS) or application environment that is installed on software, which imitates dedicated hardware. The end user has the same experience on a virtual machine as they would have on dedicated hardware. Specialized software, called a hypervisor, emulates the PC client or server's CPU, memory, hard disk, network and other hardware resources completely, enabling virtual machines to share the resources. The hypervisor can emulate multiple virtual hardware platforms that are isolated from another, allowing virtual machines to run Linux®, Windows® Server, VMware ESXi, and other operating systems on the same underlying physical host. In some examples, an operating system can issue a configuration to a data plane of network interface 1950.

A container can be a software package of applications, configurations and dependencies so the applications run reliably on one computing environment to another. Containers can share an operating system installed on the server platform and run as isolated processes. A container can be a software package that contains everything the software needs to run such as system tools, libraries, and settings. Containers may be isolated from the other software and the operating system itself. The isolated nature of containers provides several benefits. First, the software in a container will run the same in different environments. For example, a container that includes PHP and MySQL can run identically on both a Linux® computer and a Windows® machine. Second, containers provide added security since the software will not affect the host operating system. While an installed application may alter system settings and modify resources, such as the Windows registry, a container can only modify settings within the container.

In some examples, OS 1932 can be Linux®, Windows® Server or personal computer, FreeBSD®, Android®, MacOS®, iOS®, VMware vSphere, openSUSE, RHEL, CentOS, Debian, Ubuntu, or any other operating system. The OS and driver can execute on a processor sold or designed by Intel®, ARM®, AMD®, Qualcomm®, IBM®, Nvidia®, Broadcom®, Texas Instruments®, among others. In some examples, OS 1932 or driver can advertise to one or more applications or processes capability of network interface 1950 to adjust operation of programmable pipelines of network interface 1950 using a recirculated packet. In some examples, OS 1932 or driver can enable or disable network interface 1950 to adjust operation of programmable pipelines of network interface 1950 using a recirculated packet based on a request from an application, process, or other software (e.g., control plane). In some examples, OS 1932 or driver can reduce or limit capabilities of network interface 1950 to adjust operation of programmable pipelines of network interface 1950 using a recirculated packet based on a request from an application, process, or other software (e.g., control plane).

While not specifically illustrated, it will be understood that system 1900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1900 includes interface 1914, which can be coupled to interface 1912. In one example, interface 1914 represents an interface circuit, which can include standalone components and integrated circuitry. In one example, multiple user interface components or peripheral components, or both, couple to interface 1914. Network interface 1950 provides system 1900 the ability to communicate with remote devices (e.g., servers or other computing devices) over one or more networks. Network interface 1950 can include an Ethernet adapter, wireless interconnection components, cellular network interconnection components, USB (universal serial bus), or other wired or wireless standards-based or proprietary interfaces. Network interface 1950 can transmit data to a device that is in the same data center or rack or a remote device, which can include sending data stored in memory. Network interface 1950 can receive data from a remote device, which can include storing received data into memory. In some examples, network interface 1950 or network interface device 1950 can refer to one or more of: a network interface controller (NIC), a remote direct memory access (RDMA)-enabled NIC, SmartNIC, router, switch (e.g., top of rack (ToR) or end of row (EoR)), forwarding element, infrastructure processing unit (IPU), or data processing unit (DPU). An example IPU or DPU is described at least with respect to FIG. 12.

In one example, system 1900 includes one or more input/output (I/O) interface(s) 1960. I/O interface 1960 can include one or more interface components through which a user interacts with system 1900 (e.g., audio, alphanumeric, tactile/touch, or other interfacing). Peripheral interface 1970 can include any hardware interface not specifically mentioned above. Peripherals refer generally to devices that connect dependently to system 1900. A dependent connection is one where system 1900 provides the software platform or hardware platform or both on which operation executes, and with which a user interacts.

In one example, system 1900 includes storage subsystem 1980 to store data in a nonvolatile manner. In one example, in certain system implementations, at least certain components of storage 1980 can overlap with components of memory subsystem 1920. Storage subsystem 1980 includes storage device(s) 1984, which can be or include any conventional medium for storing large amounts of data in a nonvolatile manner, such as one or more magnetic, solid state, or optical based disks, or a combination. Storage 1984 holds code or instructions and data 1986 in a persistent state (e.g., the value is retained despite interruption of power to system 1900). Storage 1984 can be generically considered to be a "memory," although memory 1930 is typically the executing or operating memory to provide instructions to processor 1910. Whereas storage 1984 is nonvolatile, memory 1930 can include volatile memory (e.g., the value or state of the data is indeterminate if power is interrupted to system 1900). In one example, storage subsystem 1980 includes controller 1982 to interface with storage 1984. In one example controller 1982 is a physical part of interface 1914 or processor 1910 or can include circuits or logic in both processor 1910 and interface 1914.

A volatile memory is memory whose state (and therefore the data stored in it) is indeterminate if power is interrupted to the device. A non-volatile memory (NVM) device is a memory whose state is determinate even if power is interrupted to the device.

A power source (not depicted) provides power to the components of system 1900. More specifically, power source typically interfaces to one or multiple power supplies in system 1900 to provide power to the components of system 1900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1900 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omni-Path, Compute Express Link (CXL), HyperTransport, high-speed fabric, NVLink, Advanced Microcontroller Bus Architecture (AMBA) interconnect, OpenCAPI, Gen-Z, Infinity Fabric (IF), Cache Coherent Interconnect for Accelerators (COX), 3GPP Long Term Evolution (LTE) (4G), 3GPP 5G, and variations thereof. Data can be copied or stored to virtualized storage nodes or accessed using a protocol such as NVMe over Fabrics (NVMe-oF) or NVMe (e.g., a non-volatile memory express (NVMe) device can operate in a manner consistent with the Non-Volatile Memory Express (NVMe) Specification, revision 1.3c, published on May 24, 2018 ("NVMe specification") or derivatives or variations thereof).

Communications between devices can take place using a network that provides die-to-die communications; chip-to-chip communications; circuit board-to-circuit board communications; and/or package-to-package communications. A die-to-die communications can utilize Embedded Multi-Die Interconnect Bridge (EMIB) or an interposer.

In an example, system 1900 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (e.g., buses) for coupling appropriate integrated circuits (ICs) and other components mounted to the board.

Figure 20:
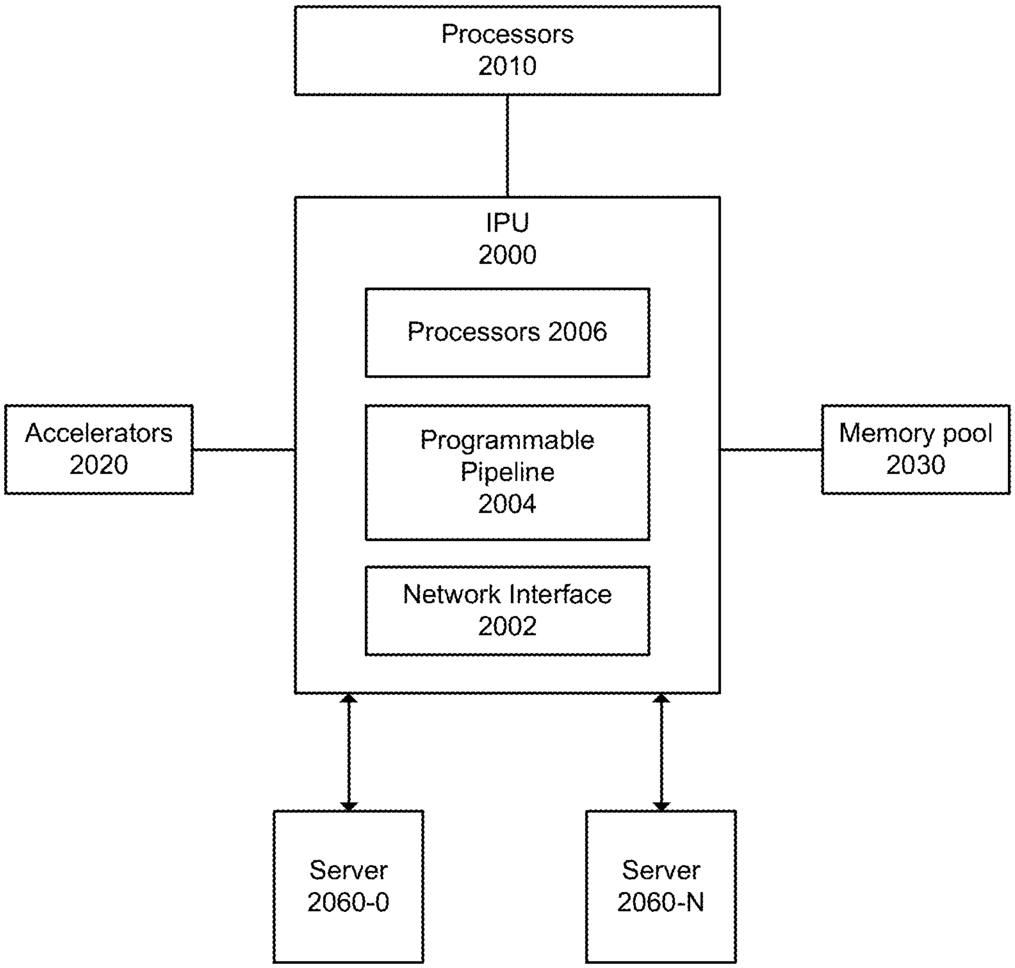
FIG. 20 depicts an example system.

FIG. 20 depicts an example system. In this system, IPU 2000 manages performance of one or more processes using one or more of processors 2006, processors 2010, accelerators 2020, memory pool 2030, or servers 2040-0 to 2040-N, where N is an integer of 1 or more. In some examples, processors 2006 of IPU 2000 can execute one or more processes, applications, VMs, containers, microservices, and so forth that request performance of workloads by one or more of: processors 2010, accelerators 2020, memory pool 2030, and/or servers 2040-0 to 2040-N. IPU 2000 can utilize network interface 2002 or one or more device interfaces to communicate with processors 2010, accelerators 2020, memory pool 2030, and/or servers 2040-0 to 2040-N. IPU 2000 can utilize programmable pipeline 2004 to process packets that are to be transmitted from network interface 2002 or packets received from network interface 2002.

Various example of power management and/or control of cooling of devices can be performed by one or more of: processors 2006 or programmable pipeline 2004.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission, or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of operations may also be performed according to alternative embodiments. Furthermore, additional operations may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."'

Illustrative examples of the devices, systems, and methods disclosed herein are provided below. An embodiment of the devices, systems, and methods may include any one or more, and any combination of, the examples described below.

An example includes one or more examples, wherein a Power and Thermal Emulation Orchestrator (PTEO) executes on a network interface device enables emulation of device power profile and temperature profile without having to run the actual workload.

Example 1 includes one or more examples, and includes an apparatus comprising: an interface and a network interface device coupled to the interface and comprising circuitry to: control power utilization by a first set of one or more devices based on power available to a system that includes the first set of one or more devices, wherein the system is communicatively coupled to the network interface and control cooling applied to the first set of one or more devices.

Example 2 includes one or more examples, wherein the system comprises a rack of servers, wherein at least one of the servers comprises the system.

Example 3 includes one or more examples, wherein the system comprises a data center of servers, wherein at least one of the servers comprises the system.

Example 4 includes one or more examples, wherein the circuitry is to communicate with second circuitry to manage power and applied cooling to a second set of more of more devices based on the power available to the system and wherein the second circuitry comprises a validated power manager.

Example 5 includes one or more examples, wherein the first set of one or more devices comprises one or more of: a central processing unit (CPU), graphics processing unit (GPU), memory device, storage device, accelerator, or application specific integrated circuit (ASIC).

Example 6 includes one or more examples, wherein the circuitry is to allocate a workload to the first set of one or more devices and control power utilization by the first set of one or more devices based on a quality of service (QoS) associated with the workload.

Example 7 includes one or more examples, wherein the network interface device comprises second circuitry and one or more devices, the second circuitry is to determine physical ambient information of the network interface device and adjust power usage of the one or more devices based on the physical ambient information of the network interface device.

Example 8 includes one or more examples, wherein the physical ambient information of the network interface device comprises one or more of: airflow rate, air flow direction, orientation, adjacent slot occupancy, or ambient noise levels.

Example 9 includes one or more examples, wherein the network interface device comprises one or more of: a network interface controller (NIC), a remote direct memory access (RDMA)-enabled NIC, SmartNIC, router, switch, forwarding element, infrastructure processing unit (IPU), or data processing unit (DPU).

Example 10 includes one or more examples and includes a server comprising the first set of one or more devices, wherein the server is communicatively coupled to the interface.

Example 11 includes one or more examples and includes a data center, wherein the data center comprises the server and a second server, the second server comprises a second set of more of more devices, and the circuitry is to manage power and applied cooling to the second set of more of more devices based on the power available to the system.

Example 12 includes one or more examples and includes a non-transitory computer-readable medium, comprising instructions stored thereon, that if executed by one or more processors, cause the one or more processors to: access a temperature profile of a device; determine power consumption of multiple portions of the device that cause the device exhibit temperatures consistent with the temperature profile; and generate data comprising the power consumption of multiple portions of the device.

Example 13 includes one or more examples and includes instructions stored thereon, that if executed by one or more processors, cause the one or more processors to: access a power profile of the device; determine whether to prioritize the temperature profile or the power profile of the device; based on prioritization of the power profile, determine a second temperature profile of the multiple portions of the device based application of the power profile of the device and subject to the temperature profile; and generate data comprising the second temperature profile of multiple portions of the device.

Example 14 includes one or more examples and includes instructions stored thereon, that if executed by one or more processors, cause the one or more processors to: based on a temperature of the temperature profile being exceeded for meeting the power profile, indicating the power profile cannot meet the temperature profile.

Example 15 includes one or more examples and includes a method comprising: a network interface device performing: controlling power utilization by a first set of one or more devices based on power available to a system that includes the first set of one or more devices, wherein the system is communicatively coupled to the network interface and controlling cooling applied to the first set of one or more devices.

Example 16 includes one or more examples and includes communicating with a power manager to manage power and applied cooling to a second set of more of more devices based on the power available to the system.

Example 17 includes one or more examples, wherein the first set of one or more devices comprises one or more of: a central processing unit (CPU), graphics processing unit (GPU), memory device, storage device, accelerator, or application specific integrated circuit (ASIC).

Example 18 includes one or more examples and includes allocating a workload to the first set of one or more devices and control power utilization by the first set of one or more devices based on a quality of service (QoS) associated with the workload.

Example 19 includes one or more examples and includes determining physical ambient information of the network interface device and adjusting power usage of the one or more devices based on the physical ambient information of the network interface device.

Example 20 includes one or more examples, wherein the physical ambient information of the network interface device comprises one or more of: airflow rate, air flow direction, orientation, adjacent slot occupancy, or ambient noise levels.

What is claimed is:

1. An apparatus comprising:

an interface; and a network interface device coupled to the interface and comprising:

first circuitry to:

control power utilization by a first set of one or more devices based on power available to a system that includes the first set of one or more devices, wherein the system is communicatively coupled to the network interface, and control cooling applied to the first set of one or more devices; and second circuitry to:

determine physical ambient information of the network interface device, wherein the physical ambient information of the network interface device comprises one or more of airflow rate, air flow direction, orientation, adjacent slot occupancy, and ambient noise levels; and adjust power usage of the first set of one or more devices based on the physical ambient information of the network interface device.

2. The apparatus of claim 1, wherein the system comprises a rack of servers, wherein at least one of the servers comprises the system.

3. The apparatus of claim 1, wherein the system comprises a data center of servers, wherein at least one of the servers comprises the system.

4. The apparatus of claim 1, wherein the first circuitry is to communicate with third circuitry to manage power and applied cooling to a second set of one or more devices based on the power available to the system and wherein the third circuitry comprises a validated power manager.

5. The apparatus of claim 1, wherein the first set of one or more devices comprises one or more of: a central processing unit (CPU), graphics processing unit (GPU), memory device, storage device, accelerator, or application specific integrated circuit (ASIC).

6. The apparatus of claim 1, wherein the first circuitry is to allocate a workload to the first set of one or more devices and control power utilization by the first set of one or more devices based on a quality of service (QoS) associated with the workload.

7. The apparatus of claim 1, wherein the network interface device comprises one or more of: a network interface controller (NIC), a remote direct memory access (RDMA)-enabled NIC, SmartNIC, router, switch, forwarding element, infrastructure processing unit (IPU), or data processing unit (DPU).

8. The apparatus of claim 1, comprising:

a server comprising the first set of one or more devices, wherein the server is communicatively coupled to the interface.

9. The apparatus of claim 8, comprising a data center, wherein the data center comprises the server and a second server, the second server comprises a second set of one or more devices, and the circuitry is to manage power and applied cooling to the second set of one or more devices based on the power available to the system.

10. A non-transitory computer-readable medium, comprising instructions stored thereon, that if executed by one or more processors, cause the one or more processors to:

access a temperature profile of a device;

determine power consumption of multiple portions of the device that cause the device to exhibit temperatures consistent with the temperature profile;

generate data comprising the power consumption of multiple portions of the device;

access a power profile of the device;

determine whether to prioritize the temperature profile or the power profile of the device;

based on prioritization of the power profile, determine a second temperature profile of the multiple portions of the device based on application of the power profile of the device and subject to the temperature profile; and generate data comprising the second temperature profile of the multiple portions of the device.

11. The computer-readable medium of claim 10 comprising instructions stored thereon, that if executed by one or more processors, cause the one or more processors to: Indicate, based on a temperature of the temperature profile being exceeded for meeting the power profile, the power profile cannot meet the temperature profile.

12. A method comprising:

a network interface device performing:

controlling power utilization by a first set of one or more devices based on power available to a system that includes the first set of one or more devices, wherein the system is communicatively coupled to the network interface device;

controlling cooling applied to the first set of one or more devices;

determining physical ambient information of the network interface device, wherein the physical ambient information of the network interface device comprises one or more of airflow rate, air flow direction, orientation, adjacent slot occupancy, and ambient noise levels; and adjusting power usage of the first set of one or more devices based on the physical ambient information of the network interface device.

13. The method of claim 12, comprising:

communicating with a power manager to manage power and applied cooling to a second set of one or more devices based on the power available to the system.

14. The method of claim 12, wherein the first set of one or more devices comprises one or more of: a central processing unit (CPU), graphics processing unit (GPU), memory device, storage device, accelerator, or application specific integrated circuit (ASIC).

15. The method of claim 12, comprising:

allocating a workload to the first set of one or more devices and control power utilization by the first set of one or more devices based on a quality of service (QoS) associated with the workload.

* * * * *